US012707839B2

(12) United States Patent
He et al.

(10) Patent No.: US 12,707,839 B2
(45) Date of Patent: Aug. 11, 2026

(54) DISPLAY PANEL AND MANUFACTURING METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Fan He, Beijing (CN); Rong Wang, Beijing (CN); Xiangdan Dong, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 380 days.

(21) Appl. No.: 18/291,997

(22) PCT Filed: Apr. 28, 2022

(86) PCT No.: PCT/CN2022/090039

§ 371 (c)(1),
(2) Date: Jan. 25, 2024

(87) PCT Pub. No.: WO2023/206278

PCT Pub. Date: Nov. 2, 2023

(65) Prior Publication Data

US 2024/0341136 A1 Oct. 10, 2024

(51) Int. Cl.
*H10K 59/131* (2023.01)
*H10K 59/10* (2023.01)
(Continued)

(52) U.S. Cl.
CPC ....... *H10K 59/131* (2023.02); *H10K 59/1201* (2023.02); *H10K 59/1213* (2023.02); *H10K 59/1216* (2023.02); *H10K 59/122* (2023.02)

(58) Field of Classification Search
CPC ............... H10K 59/10; H10K 59/1216; H10K 59/1213; H10K 59/131
See application file for complete search history.

(56) References Cited

U.S. PATENT DOCUMENTS 10,761,386 B2 9/2020 Zhang et al.
11,024,695 B2 6/2021 Liu et al.
(Continued)

FOREIGN PATENT DOCUMENTS

CN 108254984 A 7/2018
CN 109935202 A 6/2019
(Continued)

OTHER PUBLICATIONS

International Search Report and Written Opinion mailed on Jan. 9, 2023, in corresponding PCT/CN2022/090039, 13 pages.

*Primary Examiner* — Mohsen Ahmadi
(74) *Attorney, Agent, or Firm* — XSENSUS LLP

(57) ABSTRACT

A display panel and a manufacturing method therefor, and a display apparatus. The display panel comprises: a drive backplane (BM), a transfer layer (TR), a second planarization layer (PLN2), and a light-emitting layer (EE). A pixel circuit layer (DR) comprised in the drive backplane (BM) comprises a plurality of data transfer lines (DL3), wherein one end of a data transfer line (DL3) is connected to a data wiring (DL) and the other end thereof extends to a bonding
(Continued)

region (B1). Two ends of a first transfer line (TR1) comprised in the transfer layer (TR) are respectively connected to a first via hole (PLN11) and a second via hole (PLN21) that correspond to a first pixel circuit (PDCA1).

18 Claims, 17 Drawing Sheets

(51) Int. Cl.

| | |
|---|---|
| ***H10K 59/12*** | (2023.01) |
| ***H10K 59/121*** | (2023.01) |
| ***H10K 59/122*** | (2023.01) |

(56) References Cited

U.S. PATENT DOCUMENTS

| | | | | |
|---|---|---|---|---|
| 11,138,929 | B2 | 10/2021 | Park et al. | |
| 2018/0286890 | A1* | 10/2018 | Suzumura | H10D 86/423 |
| 2019/0237487 | A1 | 8/2019 | Zhang et al. | |
| 2020/0373371 | A1 | 11/2020 | Liu et al. | |
| 2021/0056898 | A1 | 2/2021 | Park et al. | |
| 2021/0242293 | A1 | 8/2021 | Liu et al. | |
| 2021/0327983 | A1* | 10/2021 | Kim | H10D 30/6723 |
| 2021/0408195 | A1* | 12/2021 | Sohn | H10K 59/126 |
| 2022/0013549 | A1* | 1/2022 | Park | H10D 86/451 |
| 2022/0013608 | A1* | 1/2022 | Kim | H10D 86/423 |
| 2022/0093697 | A1* | 3/2022 | Hong | H10K 59/121 |

FOREIGN PATENT DOCUMENTS

| | | | |
|---|---|---|---|
| CN | 110148592 | A | 8/2019 |
| CN | 111477675 | A | 7/2020 |
| CN | 111933674 | A | 11/2020 |
| CN | 212161816 | U | 12/2020 |
| CN | 112310125 | A | 2/2021 |
| CN | 113805378 | A | 12/2021 |
| CN | 114171563 | A | 3/2022 |
| CN | 114220834 | A | 3/2022 |
| CN | 113805378 | B | 7/2022 |
| CN | 112310125 | B | 8/2022 |
| JP | 2005-158672 | A | 6/2005 |
| JP | 4655102 | B2 | 3/2011 |
| JP | 6800839 | B2 | 12/2020 |
| TW | 202147287 | A | 12/2021 |
| TW | I751857 | B | 1/2022 |
| WO | 2016/143531 | A1 | 9/2016 |
| WO | 2018/179272 | A1 | 10/2018 |
| WO | 2021/249120 | A1 | 12/2021 |
| WO | 2022/037287 | A1 | 2/2022 |
| WO | 2022/037287 | A9 | 5/2022 |
| WO | 2022/089071 | A1 | 5/2022 |

* cited by examiner

DISPLAY PANEL AND MANUFACTURING METHOD THEREFOR, AND DISPLAY APPARATUS

CROSS-REFERENCE TO RELATED APPLICATION

The present application is a U.S. national phase of International Application No. PCT/CN2022/090039, filed on Apr. 28, 2022, and the entire contents thereof are incorporated herein by reference.

TECHNICAL FIELD

The present disclosure relates to the field of display technology, and specifically, to a display panel, a manufacturing method, and a display device.

BACKGROUND

With the rapid development of display technology, display devices have entered the era of full-screen and narrow bezels. In order to provide users with a better user experience, full-screen and narrow bezels will surely become important development directions in the future.

It should be noted that, information disclosed in the above background portion is provided only for better understanding of the background of the present disclosure, and thus it may contain information that does not form the prior art known by those ordinary skilled in the art.

SUMMARY

The objective of this disclosure is to provide a display panel, a manufacturing method, and a display device.

According to an aspect of the present disclosure, a display panel is provided. The display panel includes a display area and a peripheral area located outside the display area. The peripheral area includes a binding area located on one side of the display area along a column direction, the display panel includes:

a driving backplane including a substrate, a pixel circuit layer and a first planar layer stacked in sequence;

wherein the pixel circuit layer includes a plurality of pixel circuits, a plurality of data wiring lines and a plurality of data transfer lines, one column of the pixel circuits is connected to one of the data wiring lines, at least part of the pixel circuits located in the display area form a plurality of pixel circuit islands distributed in an array, a plurality of the data transfer lines are located in the display area and do not overlap with the pixel circuit islands, one end of one of the data transfer lines is connected to one of the data wiring lines in the display area, and other end is extended to the binding area;

a plurality of first via holes connected to the plurality of pixel circuits in one-to-one correspondence are disposed in the first planar layer;

a transfer layer, located on a side of the first planar layer away from the substrate, and including a first transfer line;

a second planar layer, located on a side of the transfer layer away from the substrate, and provided with a plurality of second via holes corresponding to the plurality of first via holes in one-to-one correspondence, wherein the plurality of pixel circuit islands includes a first pixel circuit, and two ends of the first transfer line are respectively connected to the first via hole and the second via hole corresponding to the first pixel circuit; and a light-emitting layer, located on a side of the second planar layer away from the substrate, and including a plurality of light-emitting units connected to the plurality of second via holes in one-to-one correspondence, wherein light-emitting areas of the light-emitting units are not overlapped with the second via holes, the plurality of light-emitting units includes a first light-emitting unit, and the light-emitting area of the first light-emitting unit has an overlapping portion with the first via hole corresponding to the first pixel circuit.

According to anyone of the display panel of the present disclosure, the plurality of pixel circuit islands includes a second pixel circuit; and the light-emitting areas of the plurality of light-emitting units do not overlap with the first via hole corresponding to the second pixel circuit, and the first via hole corresponding to the second pixel circuit has an overlapping portion with the corresponding second via hole.

According to anyone of the display panel of the present disclosure, the plurality of pixel circuit islands includes a second pixel circuit, and the transfer layer further includes a second transfer line; and the light-emitting areas of the plurality of light-emitting units do not overlap with the first via hole corresponding to the second pixel circuit, the first via hole corresponding to the second pixel circuit do not overlap with the corresponding second via hole, and two ends of the second transfer line are respectively connected to the first via hole and the second via hole corresponding to the second pixel circuit.

According to anyone of the display panel of the present disclosure, the transfer layer includes multiple layers of transfer sub-layers and an interlayer insulating layer located between any two adjacent transfer sub-layers; and the multiple transfer sub-layers each includes a first transfer sub-line, and the interlayer insulating layer includes a via hole, and the via hole is connected to the first transfer sub-lines of the transfer sub-layers located on both sides, and the multiple first transfer sub-lines are connected in sequence to form the first transfer line.

According to anyone of the display panel of the present disclosure, the pixel circuit layer includes a transistor layer, a first source-drain metal layer, a third planar layer and a second source-drain metal layer sequentially stacked in a direction away from the substrate;

the second source-drain metal layer includes a plurality of pairs of power wirings arranged along a row direction and extended along the column direction, each pair of the power wirings forms a plurality of avoidance areas, and the second source-drain metal layer further includes a pair of transfer electrodes located in the avoidance area and extended along the column direction, the plurality of transfer electrodes includes a first transfer electrode corresponding to the first pixel circuit, and the first transfer electrode is connected to the first source-drain metal layer and a first end of the first transfer line respectively; and the light-emitting layer further includes a pixel definition layer provided on a surface of the first planar layer away from the substrate, the pixel definition layer is provided with pixel openings corresponding to the plurality of the light-emitting units in one-to-one correspondence, each light-emitting unit includes a first electrode, an organic light-emitting layer and a second electrode sequentially stacked on one side in a direction away from the second planar layer, the first electrode includes an exposed area exposed at a corresponding pixel opening and a covered area covered by the pixel definition layer, the exposed area of the first electrode forms a light-emitting area of the corresponding light-emitting unit, and a second end of the first transfer line is connected to the covered area of the light-emitting unit.

According to anyone of the display panel of the present disclosure, the first transfer line is extended along the row direction, and the first end of the first transfer line has an overlapping portion with at least a part of the first transfer electrode, the first via hole corresponding to the first pixel circuit and the exposed area of the first light-emitting unit, and the second end of the first transfer line has an overlapping portion with the second via hole corresponding to the first pixel circuit and the covered area of the light-emitting unit.

According to anyone of the display panel of the present disclosure, the first transfer line is extended along the row direction, and the first end of the first transfer line has an overlapping portion with at least a part of the first transfer electrode, the first via hole corresponding to the first pixel circuit and the exposed area of the first light-emitting unit, the second end of the first transfer line has an overlapping portion with the second via hole corresponding to the first pixel circuit and the covered area of a second light-emitting unit among the plurality of light-emitting units, and the second light-emitting unit is adjacent to the first light-emitting unit.

According to anyone of the display panel of the present disclosure, the transfer layer further includes a second transfer line, and the plurality of transfer electrodes includes a second transfer electrode corresponding to the second pixel circuit;

at least part of the second transfer electrode is overlapped with the first via hole corresponding to the second pixel circuit, and is not overlapped with the exposed areas of the plurality of light-emitting units; and the second transfer line is extended along the row direction, a first end of the second transfer line has an overlapping portion with at least part of the second transfer electrode, and a second end of the second transfer line has an overlapping portion with the second via hole corresponding to the second pixel circuit and the covered area of a third light-emitting unit among the plurality of light-emitting units.

According to anyone of the display panel of the present disclosure, the data transfer line includes a first segment of wiring and a second segment of wiring;

the first segment of wiring is extended along the row direction, the second segment of wiring is extended along the column direction, one end of the first segment of wiring is connected to a data wiring, other end of the first segment of wiring is connected to one end of the second segment of wiring, and other end of the second segment of wiring is extended to the binding area; and first segment of wirings and part of the second segment of wirings of the plurality of data transfer lines are located on the first source-drain metal layer, and remaining second segment of wirings of the plurality of data transfer lines are located on the second source-drain metal layer.

According to anyone of the display panel of the present disclosure, the pixel circuit includes a first transistor, a second transistor, a third transistor, a fourth transistor, a fifth transistor, a sixth transistor, a seventh transistor and a storage capacitor;

a control electrode of the first transistor is used to load a capacitor reset control signal, a first electrode of the first transistor is used to load an initial voltage signal, and a second electrode of the first transistor is connected to a first electrode of the second transistor, a control electrode of the third transistor, and one end of the storage capacitor;

a control electrode of the second transistor is used to load a first scan signal, and a second electrode of the second transistor is connected to a first electrode of the third transistor and a first electrode of the sixth transistor;

a second electrode of the third transistor is connected to a first electrode of the fourth transistor and a first electrode of the fifth transistor, a control electrode of the fourth transistor is used to load a second scan signal, a second electrode of the fourth transistor is used to load a driving data signal, a control electrode of the fifth transistor is used to load an enable signal, a second electrode of the fifth transistor is connected to other end of the storage capacitor, and is used to load a power supply voltage signal; and a control electrode of the sixth transistor is used to the an enable signal, a second electrode of the sixth transistor is connected to a first electrode of the seventh transistor and is used to connect to the corresponding light-emitting unit, a control electrode of the seventh transistor is used to load an electrode reset control signal, and a second electrode of the seventh transistor is used to load the initial voltage signal.

According to anyone of the display panel of the present disclosure, the pixel circuit layer includes a first semiconductor layer, a first gate metal layer, a second gate metal layer, a second semiconductor layer, a third gate metal layers and a source-drain metal layer;

the first semiconductor layer includes an active layer of each of the third transistor, the fourth transistor, the fifth transistor, the sixth transistor, and the seventh transistor, and the second semiconductor layer includes an active layer of each of the first transistor and the second transistor;

the first gate metal layer is provided with a first scan line and an enable signal line extending along the row direction and sequentially arranged along the column direction, and first electrode plates located between the first scan line and the enable signal line and spaced apart along the row direction, the first scan line is used to load the first scan signal, and the enable signal line is used to load the enable signal;

the second gate metal layer is provided with an initial voltage wiring, a first reset control line and a second scan wiring extending along the row direction and sequentially arranged along the column direction, and second electrode plates located at a side of the second scan wiring away from the first reset control line and spaced apart along the row direction, the initial voltage wiring is used to load the initial voltage signal, the first reset control line is used to load the capacitor reset control signal, and the second scan line is used to load the second scan signal;

the third gate metal layer is provided with a second reset control line and a third scan line extending along the row direction and sequentially arranged along the column direction, the second reset control line is used to load the electrode reset control signal, and the third scan line is used to load the second scan signal;

the initial voltage wiring and the first reset control line are located on a side of the first scan wiring away from the enable signal line, the second scan wiring and the second electrode plate are located between the first scan wiring and the enable signal line, and the second plate has an overlapping portion with the first plate, the second reset control line is located between the initial voltage wiring and the first scan line, and has an overlapping portion with the first reset control line, and the third scan line is located between the first scan line and the second electrode and has an overlapping portion with the second scan wiring; and the transfer layer includes the transfer line extending along the row direction, and the transfer line corresponding to a previous row of pixel circuits in two adjacent rows of pixel circuits in the pixel circuit island is located on a side of the enable signal line close to the second electrode plate, and has an overlapping portion with the second electrode plate, and the transfer line corresponding to a next row of pixel circuits is located on a side of the enable signal line away from the second electrode plate.

According to anyone of the display panel of the present disclosure, the display area includes a transparent display area and a normal display area located at the periphery of the transparent display area; and a distribution density of the pixel circuits in the transparent display area is smaller than the distribution density of the pixel circuits in the normal display area, the plurality of pixel circuits include a third pixel circuit located in the normal display area, the transfer layer further includes a third transfer line, and two ends of the third transfer line are respectively connected to the third pixel circuit and one of the light-emitting units in the transparent display area.

According to anyone of the display panel of the present disclosure, the display area includes a main display area and a secondary display area located on one side or both sides of the main display area along the row direction; and the plurality of pixel circuit islands and the plurality of data transfer lines are located in the main display area, and one end of one of the data transfer lines is extended into the secondary display area and is connected to one of the data wirings, and other end is extended to the binding area.

According to anyone of the display panel of the present disclosure, the material of the first transfer line is a transparent conductive material.

According to a second aspect of the present disclosure, there is provided a method of manufacturing display panel, including:

forming a driving backplane, the driving backplane including a substrate, a pixel circuit layer and a first planar layer stacked in sequence;

wherein display panel includes a display area and a peripheral area located outside the display area, wherein the peripheral area includes a binding area located on one side of the display area along a column direction, the pixel circuit layer includes a plurality of pixel circuits, a plurality of data wiring lines and a plurality of data transfer lines, one column of the pixel circuits is connected to one of the data wiring lines, at least part of the pixel circuits located in the display area form a plurality of pixel circuit islands distributed in an array, a plurality of the data transfer lines are located in the display area and do not overlap with the pixel circuit islands, one end of one of the data transfer lines is connected to one of the data wiring lines in the display area, and other end is extended to the binding area, and a plurality of first via holes connected to the plurality of pixel circuits in one-to-one correspondence are disposed in the first planar layer;

forming a transfer layer on a side of the first planar layer away from the substrate, the transfer layer including a first transfer line;

forming a second planar layer a side of the transfer layer away from the substrate, wherein the second planar layer is provided with a plurality of second via holes corresponding to the plurality of first via holes in one-to-one correspondence, the plurality of pixel circuit islands includes a first pixel circuit, and two ends of the first transfer line are respectively connected to the first via hole and the second via hole corresponding to the first pixel circuit; and forming a light-emitting layer on a side of the second planar layer away from the substrate, the light-emitting layer including a plurality of light-emitting units connected to the plurality of second via holes in one-to-one correspondence, wherein light-emitting areas of the light-emitting units are not overlapped with the second via holes, the plurality of light-emitting units includes a first light-emitting unit, and the light-emitting area of the first light-emitting unit has an overlapping portion with the first via hole corresponding to the first pixel circuit.

According to a third aspect of the present disclosure, a display device is provided, including the display panel according to the above first aspect.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description, serve to explain the principles of the disclosure. Obviously, the drawings in the following description are only some embodiments of the present disclosure. For those of ordinary skill in the art, other drawings can be obtained based on these drawings without exerting creative efforts.

DETAILED DESCRIPTION

Figure 1:
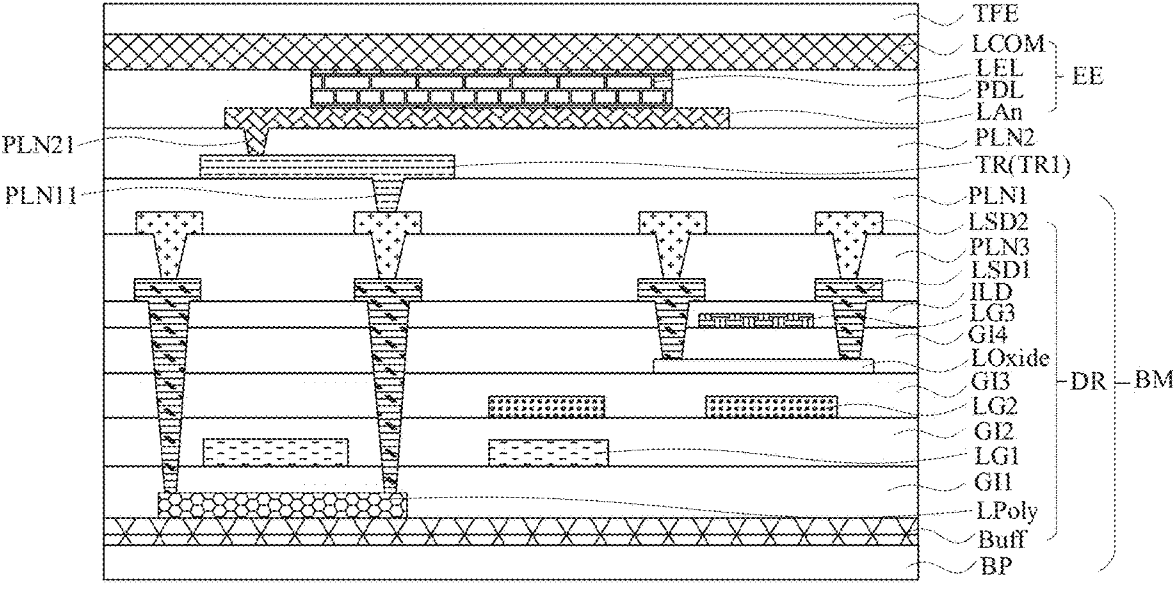
FIG. 1 is a schematic cross-sectional structural diagram of a display panel provided by an embodiment of the present disclosure.

Example embodiments will now be described more fully with reference to the accompanying drawings. Example embodiments may, however, be embodied in various forms and should not be construed as limited to the embodiments set forth herein; rather, these embodiments are provided so that this disclosure will be thorough and complete and will fully convey the concepts of the example embodiments. To those skilled in the art. The same reference numerals in the drawings indicate the same or similar structures, and thus their detailed descriptions will be omitted. Furthermore, the drawings are merely schematic illustrations of the present disclosure and are not necessarily drawn to scale.

Although relative terms, such as "upper" and "lower" are used in this specification to describe the relative relationship of one component illustrated in the figure to another component, these terms are used in this specification only for convenience, for example, according to the example direction shown in the drawings. It will be understood that if the icon device were turned upside down, components described as "upper" would become components as "lower". When a structure is "on" another structure, it may mean that the structure is integrally formed on the other structure, or that the structure is "directly" disposed on the other structure, or that the structure is "indirectly" disposed on the other structure through another structure.

The terms "a", "an", "the", "said" and "at least one" are used to indicate the presence of one or more elements/components/etc.; the terms "include" and "have" are used to indicate the meaning of an open-ended inclusive, and mean that there may be additional elements/components/etc. in addition to those listed; the terms "first", "second", "third" etc. are only used as a marker, not a limit on the number of its objects.

Embodiments of the present disclosure provide a display device including a display panel. The display panel can achieve a full-screen display and a narrow frame of the display device, while ensuring the flatness of the light-emitting area of the light-emitting unit, thereby avoiding the problem of color shift when the display panel displays a picture. In this way, a display device including the display panel can achieve a full screen and narrow bezel while ensuring the display effect of the screen.

Hereinafter, the display panel will be explained in detail through the following implementation.

Embodiments of the present disclosure provide a display panel. As shown in FIG. 1, the display panel includes a driving backplane BM and a light-emitting layer EE. The driving backplane BM includes a substrate BP, a pixel circuit layer DR and a first planar layer PLN1 that are stacked in sequence.

In the embodiment, the pixel circuit layer DR includes a plurality of pixel circuits PDCA, the first planar layer PLN1 is provided with a plurality of first via holes PLN11, the light-emitting layer EE includes a plurality of light-emitting units EL distributed in an array, the plurality of pixel circuits PDCA, the plurality of the first via hole PLN11 and the plurality of light-emitting units EL are in one-to-one correspondence. Each first via hole PLN11 is connected to the corresponding pixel circuit PDCA and the light-emitting unit EL respectively, so that the corresponding light-emitting unit EL can be controlled to emit light under the driving of the pixel circuit PDCA.

In the embodiment of the present disclosure, the substrate BP may be a substrate of inorganic material or an organic light-emitting substrate. For example, in some embodiments, the material of the substrate BP can be glass materials such as soda-lime glass, quartz glass, sapphire glass, or metal materials such as stainless steel, aluminum, nickel, etc. In other embodiments, the material of the substrate BP may be polymethyl methacrylate (PMMA), polyvinyl alcohol (PVA), polyvinyl phenol (PVP), polyether sulfone (PES), polyimide, polyamide, polyacetal, polycarbonate (PC), polyethylene terephthalate (PET), polyethylene naphthalate (PEN) or combinations thereof.

Optionally, the substrate BP may be a composite of multiple layers of materials in addition to a single layer of material. For example, in some embodiments, the substrate BP includes a base film layer, a pressure-sensitive adhesive layer, a first polyimide layer and a second polyimide layer that are stacked in sequence.

In the embodiment of the present disclosure, any pixel circuit PDCA may include multiple transistors and storage capacitors. Further, the transistor can be a thin film transistor, and the thin film transistor can be selected from a top gate thin film transistor, a bottom gate thin film transistor, or a double gate thin film transistor; the material of the active layer of the thin film transistor can be amorphous silicon semiconductor material, low temperature polysilicon semiconductor materials, metal oxide semiconductor materials, organic semiconductor materials or other types of semiconductor materials; the thin film transistor can be an N-type thin film transistor or a P-type thin film transistor.

It can be understood that among the multiple transistors included in a pixel circuit PDCA, the types of any two transistors may be the same or different. For example, in some implementations, some of the transistors in one pixel circuit PDCA may be N-type transistors and some of the transistors may be P-type transistors. As another example, in other embodiments, the material of the active layer of some transistors in a pixel circuit PDCA may be a low-temperature polysilicon semiconductor material, and the material of the active layer of some of the transistors may be a metal oxide semiconductor material.

In the embodiment of the present disclosure, the pixel circuit layer DR includes a transistor layer, an interlayer electrolyte layer ILD and a source-drain metal layer that are sequentially stacked on the substrate BP.

Alternatively, the transistor layer may include a semiconductor layer, a gate insulating layer, and a gate metal layer stacked between the substrate BP and the interlayer electrolyte layer ILD. The positional relationship of each film layer can be determined according to the film layer structure of the thin film transistor.

In some embodiments, the transistor layer may include a semiconductor layer, a gate insulating layer, and a gate metal layer that are stacked in sequence. The thin film transistor thus formed is a top-gate thin film transistor. In other embodiments, the transistor layer may include a gate metal layer, a gate insulating layer, and a semiconductor layer that are stacked in sequence. The thin film transistor thus formed is a bottom-gate thin film transistor.

In some embodiments, the semiconductor layer can be used to form the active layer of the transistor. The active layer of the semiconductor includes a channel region and source and drain electrodes located on both sides of the channel region; wherein the channel region can maintain semiconductor characteristics, the semiconductor materials of the source and drain electrodes are partially or completely conductive. The gate metal layer can be used to form gate metal layer wiring such as scan lines, enable signal lines EML, and reset control lines, and can also be used to form part or all of the electrode plates of the storage capacitor. The source-drain metal layers can be used to form source-drain metal layer wiring such as data wirings DL, power wirings VDDL, and conductive structures.

In some embodiments, the semiconductor layer may be one semiconductor layer or two semiconductor layers. For example, in some embodiments, the semiconductor layer may include a low-temperature polysilicon semiconductor layer and a metal oxide semiconductor layer. The gate metal layer may be one gate metal layer, or two or three gate metal layers. For example, in some implementations, the gate metal layer may include a first gate metal layer LG1, a second gate metal layer LG2, and a third gate metal layer LG3.

It can be understood that when the gate metal layer or semiconductor layer has a multi-layer structure, the insulating layer in the transistor layer can be adaptively increased or decreased. Exemplarily, in some embodiments, as shown in FIG. 1, the transistor layer included in the pixel circuit layer DR may include layers stacked in sequence at the substrate BP, including a first semiconductor layer LPoly (low-temperature polysilicon semiconductor layer), a first gate insulating layer GI1, a first gate metal layer LG1, a second gate insulating layer GI2 (such as silicon nitride, silicon oxide and other inorganic layers), a second gate metal layer LG2, a third gate insulating layer GI3, a second semiconductor layer LOxide (metal oxide semiconductor layer), a fourth gate insulating layer GI4, and third gate metal layer LG3, and the like.

Optionally, the source-drain metal layers may be one source-drain metal layer, or may be two or three source-drain metal layers. For example, in some embodiments, as shown in FIG. 1, the source-drain metal layers included in the pixel circuit layer DR may include a first source-drain metal layer LSD1 and a second source-drain metal layer LSD2. A third planarization layer PLN3 may be provided between the first source-drain metal layer LSD1 and the second source-drain metal layer LSD2, or a passivation layer PVX and a third planarization layer PLN3 may be provided. The first source-drain metal layer LSD1 can be used to configure the conductive structure, and the second source-drain metal layer LSD2 can be used to configure the power wiring VDDL and the data wiring DL.

Optionally, as shown in FIG. 1, the pixel circuit layer DR may also include an insulating buffer layer Buff provided between the substrate BP and the semiconductor layer, and the semiconductor layer, the gate metal layer, etc. are located on a side of the insulating buffer layer Buff away from the substrate BP. The material of the insulating buffer layer Buff can be inorganic insulating materials such as silicon oxide and silicon nitride. The insulating buffer layer Buff may be a layer of inorganic material, or may be multiple layers of laminated inorganic material layers.

Optionally, a light-shielding layer may also be provided between the insulating buffer layer Buff and the substrate BP. The light-shielding layer may overlap with at least part of the channel region of the transistor to block light irradiating to the transistor, thereby stabilizing the electrical characteristics of the transistor.

In the embodiment of the present disclosure, the light-emitting unit EL may be an organic electroluminescent diode, a micro-luminescent diode, a quantum dot-organic electroluminescent diode, a quantum dot light-emitting diode or other types of light-emitting unit EL. For example, in some embodiments, if the light-emitting unit EL is an organic electroluminescent diode, then the display panel is an OLED display panel. As follows, taking the light-emitting unit EL as an organic electroluminescent diode as an example, a feasible structure of the light-emitting layer EE is introduced as an example.

Optionally, as shown in FIG. 1, the light-emitting layer EE also includes a pixel definition layer PDL provided on the surface of the first planar layer PLN1 away from the substrate BP. The pixel definition layer PDL is provided with a plurality of pixel openings corresponding to the light-emitting units EL one by one. The light-emitting unit EL includes a first electrode LAn1, an organic light-emitting layer LEL and a second electrode LCOM1 sequentially stacked on one side in the direction away from the second planar layer PLN2. The first electrode LAn1 includes an exposed area LAn2 in the corresponding pixel opening and a covered area LAn3 covered by the pixel definition layer PDL, the exposed area LAn2 of the first electrode LAn1 form the light-emitting area of the corresponding light-emitting unit EL.

In the embodiment, the organic light-emitting layer LEL may include an organic electroluminescent material layer, and may include one or more of a hole injection layer, a hole transport layer, an electron blocking layer, a hole blocking layer, an electron transport layer and an electron injection layer.

In some embodiments, as shown in FIG. 1, the display panel may further include a thin film encapsulation layer TEF. The thin film encapsulation layer TEF is provided on the surface of the light-emitting layer EE away from the substrate BP, and may include alternately stacked inorganic encapsulation layer and organic encapsulation layer. The inorganic encapsulation layer can effectively block external moisture and oxygen, preventing water and oxygen from invading the organic light-emitting functional layer and causing material degradation. The organic encapsulation layer is located between two adjacent inorganic encapsulation layers to achieve planarization and reduce stress between the inorganic encapsulation layers.

In the embodiment, the edge of the inorganic encapsulation layer may be located in the peripheral area BB. The edge of the organic encapsulation layer may be located between the edge of the display area and the edge of the inorganic encapsulation layer. Exemplarily, the thin film encapsulation layer includes a first inorganic encapsulation layer, an organic encapsulation layer and a second inorganic encapsulation layer sequentially stacked on the side of the light-emitting layer EE away from the substrate BP.

In some embodiments, the display panel may further include a touch functional layer. The touch functional layer is provided on a side of the thin film encapsulation layer away from the substrate BP, and is used to implement a touch operation of the display panel.

In some embodiments, the display panel may further include an anti-reflection layer. The anti-reflection layer may be disposed on a side of the thin film encapsulation layer away from the light-emitting layer EE. Further, the anti-reflection layer may be disposed on a side of the touch functional layer away from the substrate BP. The anti-reflective layer is used to reduce the reflection of ambient light by the display panel, thereby reducing the impact of ambient light on the display effect.

Optionally, the anti-reflection layer may include a stacked color filter layer and black matrix layer, which can avoid reducing the light transmittance of the display panel while reducing ambient light interference. Alternatively, the anti-reflection layer may be a polarizer, for example, a patterned coated circular polarizer.

Figure 2:
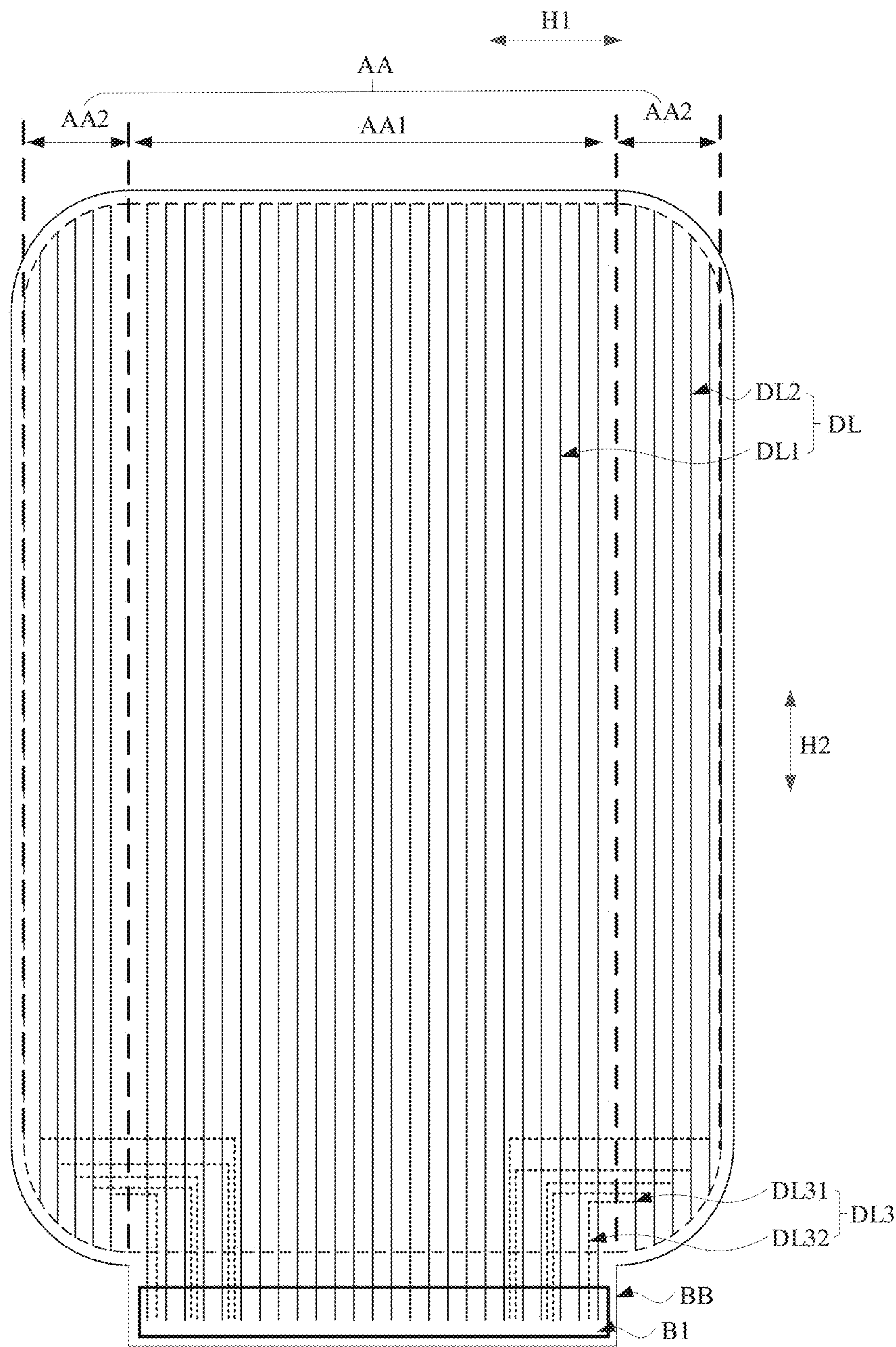
FIG. 2 is a schematic structural diagram of a display panel provided by an embodiment of the present disclosure.

Embodiments of the present disclosure provide a display panel. As shown in FIG. 2, the display panel includes a display area AA and a peripheral area BB located outside the display area AA. The peripheral area BB includes a binding area B1 located on one side of the display area AA along the column direction H2.

The pixel circuit layer DR also includes a plurality of data wirings DL. A plurality of pixel circuits PDCA form multiple columns, and one column of pixel circuits PDCA is connected to one data wiring DL.

As shown in FIG. 2, the display area AA includes a main display area AA1 and a secondary display area AA2 located on one or both sides of the main display area AA1 along the row direction H1. The plurality of data wirings DL include a first data wiring DL1 located in the main display area AA1 and a second data wiring DL2 located in the secondary display area AA2. The first data wiring DL1 located in the main display area AA1 directly extends to the binding area B1 for binding with the external circuit. If the second data wiring DL2 located in the secondary display area AA2 directly extends to the binding area B1, it is inevitable to increase the frame width of the display device. In order to realize the full screen and narrow frame of the display device, the data transfer line DL3 is required to transfer the second data wiring DL2 of the secondary display area AA2, to extend from the main display area AA1 to the binding area B1.

In this way, the pixel circuit layer DR also includes a plurality of data transfer lines DL3. The plurality of data transfer lines DL3 are located in the display area AA, and one end of one data transfer line DL3 is connected to a data wiring DL in the display area AA, and the other end is extended to the binding area B1. Combined with the above situation that the display area AA includes the main display area AA1 and the secondary display area AA2, as shown in FIG. 2, multiple data transfer lines DL3 are located in the main display area AA1, and one end of one data transfer line DL3 is connected to one second data line DL2 (that is, one end of a data transfer line DL3 is connected to a data line DL in the secondary display area AA2), and the other end is extended to the binding area B1. Therefore, under the transferring effect of the data transfer line DL3, the second data wiring DL2 (the data wiring DL of the secondary display area AA2) is adjusted to extend from the main display area AA1 to the binding area B1, thus avoiding the technical problem of increasing the frame of the display device due to the second data wiring DL2 being directly extended to the binding area B1.

In order to facilitate disposing multiple data transfer lines DL3 in the display panel and avoid position conflicts with the pixel circuit PDCA, the pixel circuit PDCA can be shrunken (that is, the line width and line spacing of the pixel circuit PDCA are shrunken), so that a gap where the data transfer line DL3 is arranged can be formed between the two pixel circuits PDCA. That is, at least part of the pixel circuit PDCA in the display area AA is shrunken to obtain a plurality of pixel circuit islands PDCC distributed in an array.

Figure 3:
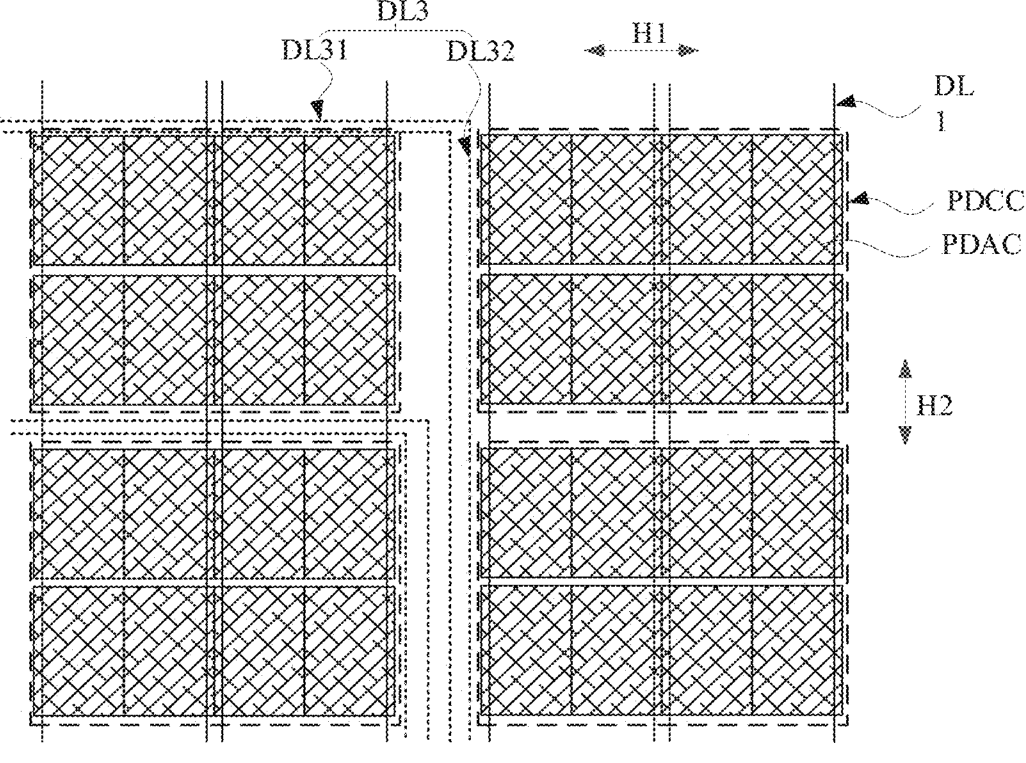
FIG. 3 is a schematic layout diagram of a data transfer wiring provided by an embodiment of the present disclosure.

Combined with the above-mentioned distribution of multiple data transfer lines DL3 (located in the main display area AA1), as shown in FIG. 3, at least part of the pixel circuits PDCA located in the main display area AA1 form multiple pixel circuit islands PDCC distributed in an array, at this time, the multiple data transfer lines DL3 do not overlap with the pixel circuit island PDCC. For example, the data transfer line DL3 is located in a gap between adjacent pixel circuit islands PDCC. Of course, since multiple data transfer lines DL3 need to be connected to multiple second data lines DL, at least part of the pixel circuits PDCA in the secondary display area AA2 can also be shrunken to obtain multiple pixel circuit islands PDCC.

In the embodiment, one pixel circuit PDCA can be shrunken as a group to obtain a pixel circuit island PDCC including one pixel circuit PDCA, or four pixel circuits PDCA can be shrunken as a group to obtain a pixel circuit island PDCC including four pixel circuits PDCA, or as shown in FIG. 3, eight pixel circuits PDCA are shrunken as a group to obtain a pixel circuit island PDCC including eight pixel circuits PDCA. Of course, other numbers of pixel circuits PDCA can also be used as a group for shrinking, and the embodiments of the present disclosure are not limited to this.

In some embodiments, as shown in FIG. 2 or FIG. 3, the data transfer line DL3 includes a first segment of wiring DL31 extending along the row direction H1 and a second segment of wiring DL32 extending along the column direction H2. The first segment of wiring DL32 extends along the row direction H1. One end of the segment of wiring DL31 is connected to a data wiring DL (a second data wiring DL2 in the secondary display area AA2), the other end is connected to one end of the second segment of wiring DL32, and the other end of the second segment of wiring DL32 is extended to the binding area B1.

Figure 4:
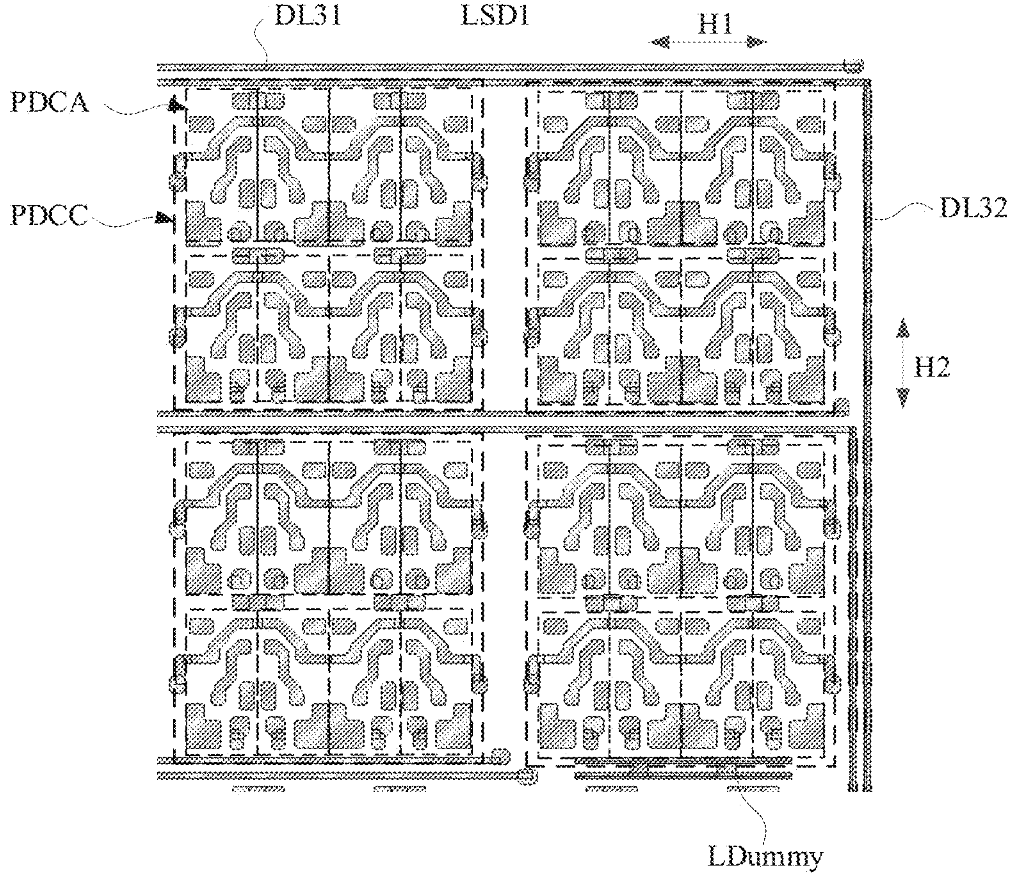
FIG. 4 is a schematic diagram of the wiring of a first source-drain metal layer according to an embodiment of the present disclosure.
Figure 5:
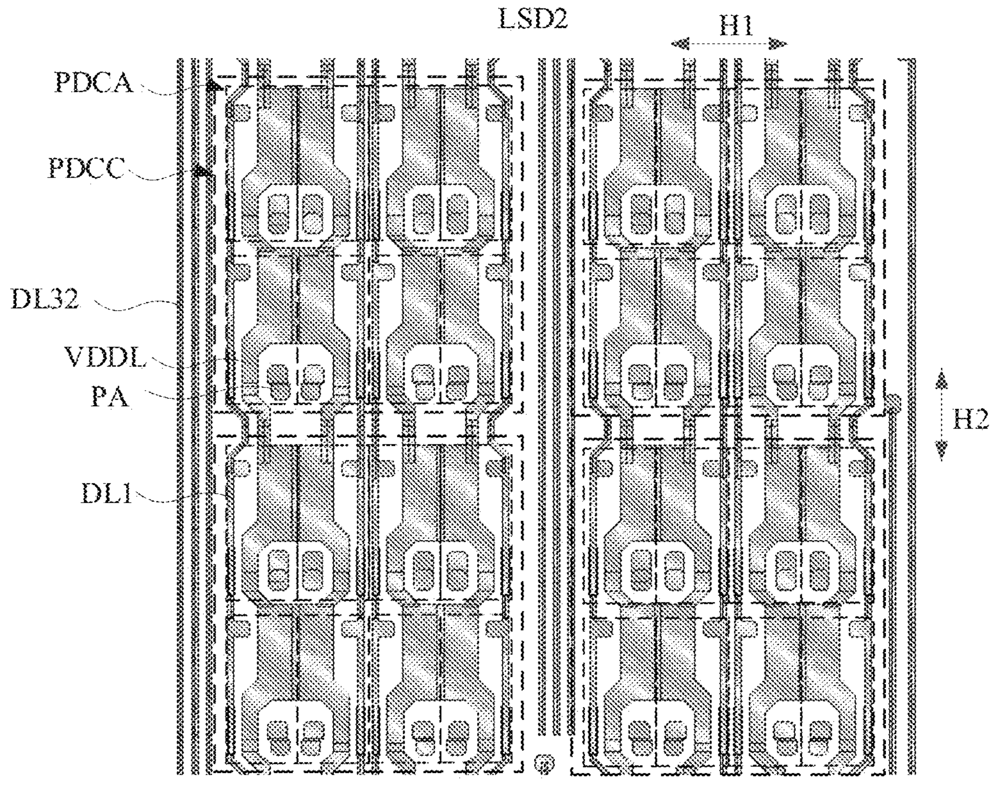
FIG. 5 is a schematic diagram of the wiring of a second source-drain metal layer according to an embodiment of the present disclosure.

In combination with the above, as shown in FIG. 3, the gaps of the pixel circuit island PDCC include row gaps along the row direction H1 and column gaps along the column direction H2. The first segment of wiring DL31 is located in the row gap of the pixel circuit island PDCC. The second segment of wiring DL32 is located in the column gap of the pixel circuit island PDCC. In conjunction with the above, in the case where the source-drain metal layer includes the first source-drain metal layer LSD1 and the second source-drain metal layer LSD2, as shown in FIGS. 4 and 5, the plurality of first segment of wirings DL31 included in the plurality of data transfer lines DL3 are all located on the first source-drain metal layer LSD1, part of the second segment of wirings DL32 included in the plurality of data transfer lines DL3 are located on the first source-drain metal layer LSD1, and the remaining part of the second segment of wirings DL32 are located on the second source-drain metal layer LSD2. The second segment of wiring DL32 of the second source-drain metal layer LSD2 and the corresponding first segment of wiring DL31 of the first source-drain metal layer LSD1 are connected by the via hole that penetrates the third planarization layer PLN3, or penetrates the passivation layer PVX and the third planarization layer PLN3.

As shown in FIG. 4, the first source-drain metal layer LSD1 also includes a compensation metal wire LDummy, and the compensation metal wire LDummy is located in the gap between two adjacent pixel circuit islands PDCC. By providing the compensation metal trace LDummy, the problem of uneven metal trace distribution in the first source-drain metal layer LSD1 can be avoided. The compensation metal trace LDummy can be connected to the power wiring VDDL of the second source-drain metal layer LSD2 through a via hole.

Figure 6:
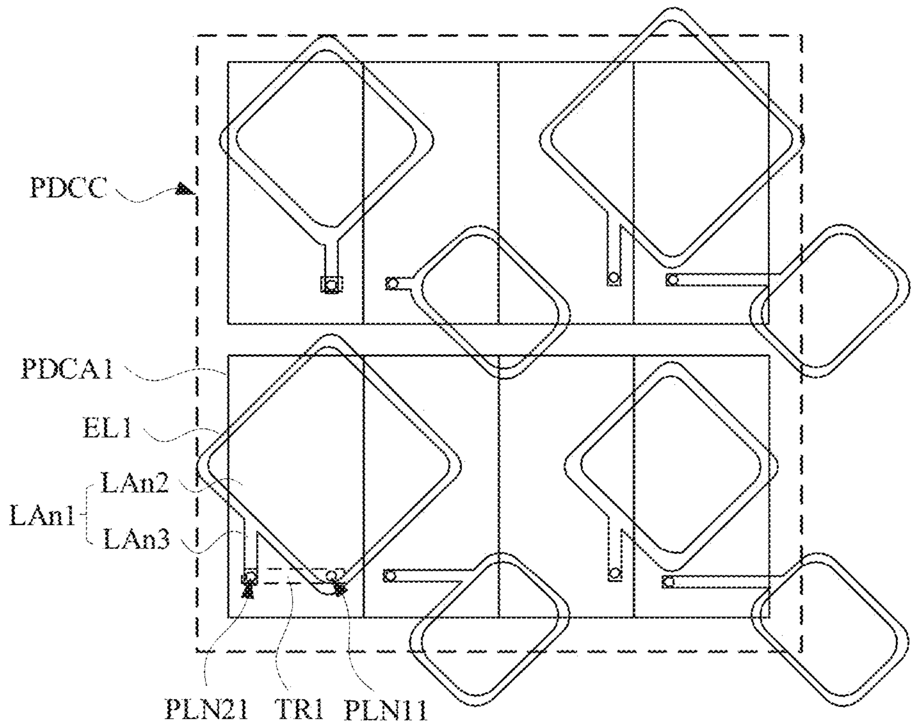
FIG. 6 is a schematic diagram of a stacked structure of a pixel circuit and a light-emitting unit provided by an embodiment of the present disclosure.

In the embodiment of the present disclosure, when the pixel circuit PDCA is shrunken, the first via hole PLN11 corresponding to part of the pixel circuit PDCA will be shifted to just below the light-emitting area of the light-emitting unit EL (the exposed area LAn2 of the first electrode LAn1). That is, as shown in FIG. 6, the plurality of pixel circuit islands PDCC include the first pixel circuit PDCA1, the plurality of light-emitting units EL include the first light-emitting unit EL1, and the light-emitting area of the first light-emitting unit EL1 has an overlapping portion with first via hole PLN11 corresponding to the first pixel circuit PDCA1. In this way, if the light-emitting layer EE is directly formed on the side of the first planar layer PLN1 away from the substrate BP, the light-emitting area of the first light-emitting unit EL1 will have the uneven problem at the first via hole PLN11 corresponding to the first pixel circuit PDCA1, resulting in color shift problems when the display panel displays images.

In this way, in order to ensure the planarization of the first light-emitting unit EL1, as shown in FIG. 1, the display panel also includes a transfer layer TR and a second planar layer PLN2 located between the first planar layer PLN1 and the light-emitting layer EE. The transfer layer TR is located on the side close to the first planar layer PLN1.

The overlapping portion involved in this disclosure means that the orthographic projections of the two on the substrate BP at least partially overlap. For example, the light-emitting area of the first light-emitting unit EL1 has an overlapping portion with the first via hole PLN11 corresponding to the first pixel circuit PDCA1, and it means that the orthographic projection of the light-emitting area of the first light-emitting unit EL1 on the substrate BP at least partially coincides with the orthographic projection of the first via hole PLN11 corresponding to the first pixel circuit PDCA1 on the substrate BP.

In the embodiment, the second planar layer PLN2 is provided with a plurality of second via holes PLN21 corresponding to the plurality of first via holes PLN11. The plurality of second via holes PLN21 are connected to the plurality of light-emitting units EL in a one-to-one correspondence, and the light-emitting area of the light-emitting units of EL does not overlap with the second via hole PLN21. As shown in FIGS. 1 and 6, the transfer layer TR includes a first transfer line TR1, one end of the first transfer line TR1 is connected to the first via hole PLN11 corresponding to the first pixel circuit PDCA1, and the other end of the first transfer line TR1 is connected to the second via hole PLN21 corresponding to the first pixel circuit PDCA1, so as to realize the connection between the first pixel circuit PDCA1 and the corresponding light-emitting unit EL.

The first transfer line TR1 may be made of a transparent conductive material, or of course may be made of a non-transparent conductive material, which is not limited in the embodiment of the present disclosure.

The "not overlap" involved in this disclosure means that the orthographic projection of one on the substrate BP is located outside the orthographic projection of the other on the substrate BP. For example, the light-emitting area of the light-emitting unit EL does not overlap with the second via hole PLN21, which means that the orthographic projection of the light-emitting area of the light-emitting unit EL on the substrate BP is located outside the orthographic projection of the second via hole PLN21 on the substrate BP.

In this way, by disposing the first transfer line TR1, the connection point of the first light-emitting unit EL1 is transferred from the first via hole PLN11 to the position of the second via hole PLN21, thereby ensuring the flattening of the unit EL1 when the first light-emitting layer EE is subsequently formed, thereby avoiding the problem of color shift in the produced display panel when displaying an image. Combined with the above-mentioned structures of the light-emitting layer EE and the light-emitting unit EL, under the action of the first transfer line TR1, the planarization of the subsequently produced first electrode LAn1 can be ensured, thereby preventing the problem of color shift in the produced display panel.

In the embodiment, the first light-emitting unit EL1 may be a light-emitting unit EL correspondingly connected to the first pixel circuit PDCA1, or may not be a light-emitting unit EL adjacent to the light-emitting unit EL correspondingly connected to the first pixel circuit PDCA1. For details, please refer to the following explanation of the relative position of the first transfer line TR1 and the first light-emitting unit EL1.

Of course, when the pixel circuit PDCA is shrunken, the first vias PLN11 corresponding to other parts of the pixel circuits PDCA in the multiple pixel circuit islands PDCC will not be shifted to directly below the light-emitting unit EL, that is, the multiple pixel circuit islands PDCC includes a second pixel circuit PDCA2, and the light-emitting areas of the plurality of light-emitting units EL do not overlap with the first via holes PLN11 corresponding to the second pixel circuit PDCA2.

In this way, when connecting the second pixel circuit PDCA2 and the corresponding light-emitting unit EL, the corresponding second via hole PLN21 and the first via hole PLN11 corresponding to the second pixel circuit PDCA2 can be directly connected, or of course, can also be connected through the second transfer line TR2.

Figure 7:
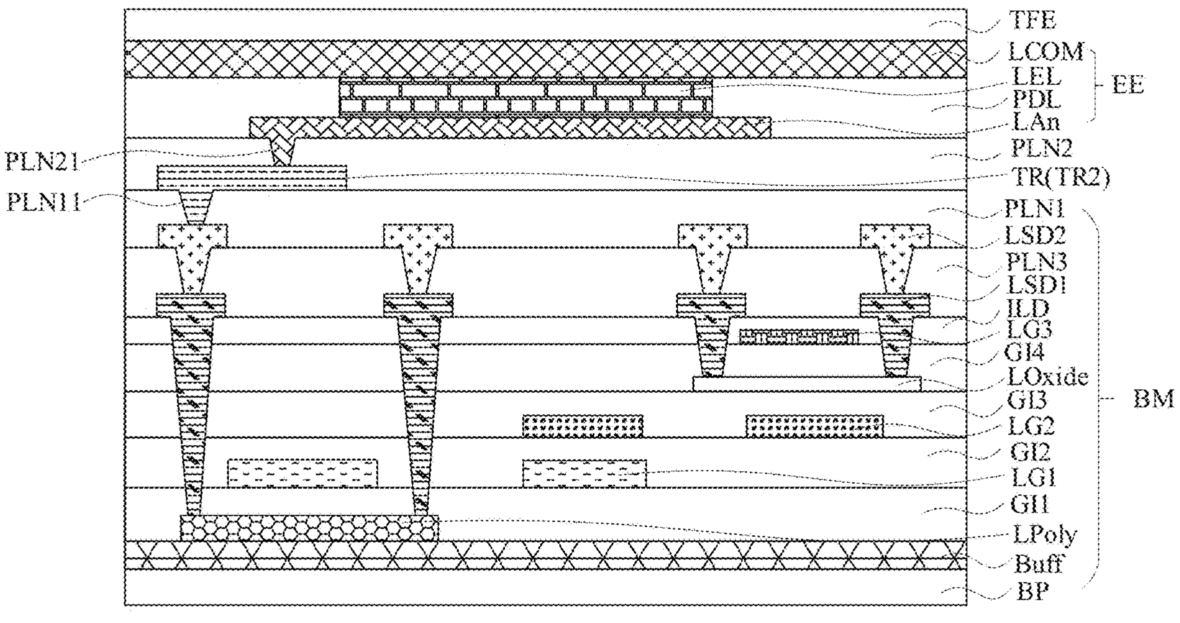
FIG. 7 is a schematic cross-sectional structural diagram of another display panel provided by an embodiment of the present disclosure.

For example, the first via hole PLN11 corresponding to the second pixel circuit PDCA2 and the corresponding second via hole PLN21 have an overlapping portion. In this way, the first via hole PLN11 corresponding to the second pixel circuit PDCA2 is directly connected to the corresponding second via hole PLN21, thereby realizing the connection between the second pixel circuit PDCA2 and the corresponding light emitting unit EL. Alternatively, the first via hole PLN11 corresponding to the second pixel circuit PDCA2 and the corresponding second via hole PLN21 do not overlap, that is, the first via hole PLN11 corresponding to the second pixel circuit PDCA2 and the corresponding second via hole PLN21 are offset. In this case, as shown in FIG. 6 and FIG. 7, the transfer layer TR includes a second transfer line TR2, and the two ends of the second transfer line TR2 are respectively connected to the first via hole PLN11 corresponding to the second pixel circuit PDCA2, and the corresponding second via hole PLN21, to realize the connection between the second pixel circuit PDCA2 and the corresponding light-emitting unit EL.

The second transfer line TR2 may be made of a transparent conductive material, or of course may be a non-transparent conductive material, which is not limited in the embodiment of the present disclosure.

It should be noted that, among the above two connection methods, the method of connecting through the second transfer line TR2, compared with the above direct connection method, can avoid the problem of increasing manufacturing difficulty due to ensuring the accurately alliance of the first via hole PLN11 and the second via hole PLN21 of the second pixel circuit PDCA2 when forming the second via hole PLN21 in the second planar layer PLN2.

Figure 8:
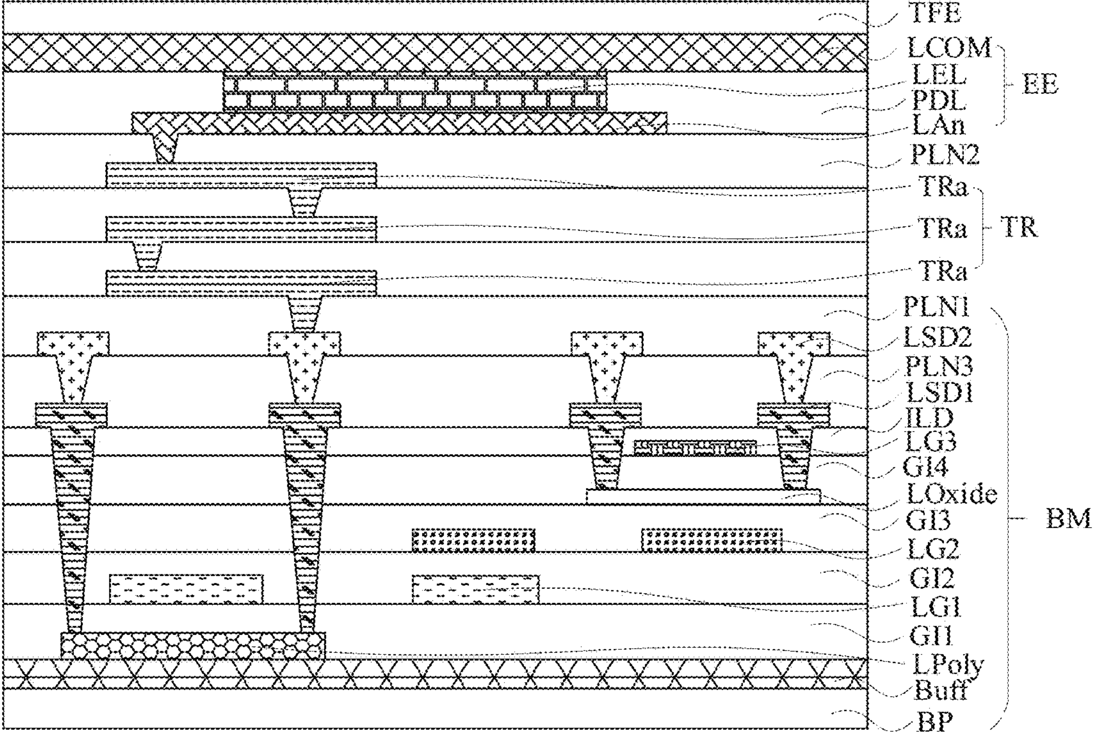
FIG. 8 is a schematic cross-sectional structural diagram of yet another display panel provided by an embodiment of the present disclosure.

In the embodiment of the present disclosure, the transfer layer TR can be a single-layer structural layer, that is, the transfer layer TR is a single-layer wiring layer including the first transfer line TR1 and the second transfer line TR2. Of course, the transfer layer TR can also be a multi-layer structure, that is, the transfer layer TR may include multiple transfer sub-layers TR and an interlayer insulation layer located between any two adjacent transfer sub-layers TR. Since the thickness of the interlayer insulating layer is thin, after stacking multiple wiring layers, the thickness of the wiring layer can be increased, thereby reducing the transmission resistance. For example, as shown in FIG. 8, the transfer layer TR includes three transfer sub-layers TRa and two interlayer insulating layers, and the three transfer sub-layers TRa and the two interlayer insulating layers are alternately stacked.

In the embodiment, the multi-layer transfer sub-layers TRa each has a first transfer sub-line, and the inter-layer insulating layers each has a via hole. The via hole is connected respectively with the first transfer sub-lines of the transfer sub-layers Tra at both sides of the corresponding inter-layer insulating layer. In this way, the first transfer line TR1 can be formed after the plurality of first transfer sub-lines are connected, thereby realizing the connection between the corresponding second via hole PLN21 and the first via hole PLN11 corresponding to the first pixel circuit PDCA1. Similarly, the multi-layer transfer sub-layers TRa each has second transfer sub-lines, and the second transfer sub-line can be formed after the multiple second transfer sub-lines are connected through the via holes of the inter-layer insulation layer, thereby realizing the connection between the corresponding second via hole PLN21 and the first via hole PLN11 corresponding to the second pixel circuit PDCA2.

In the embodiment, the orthographic projections of the multiple first transfer sub-lines on the substrate BP substrate can completely overlap or partially overlap, as long as the multiple first transfer sub-lines can be connected through the via holes on the interlayer insulating layer. The embodiments of the present disclosure do not limit this.

Figure 9:
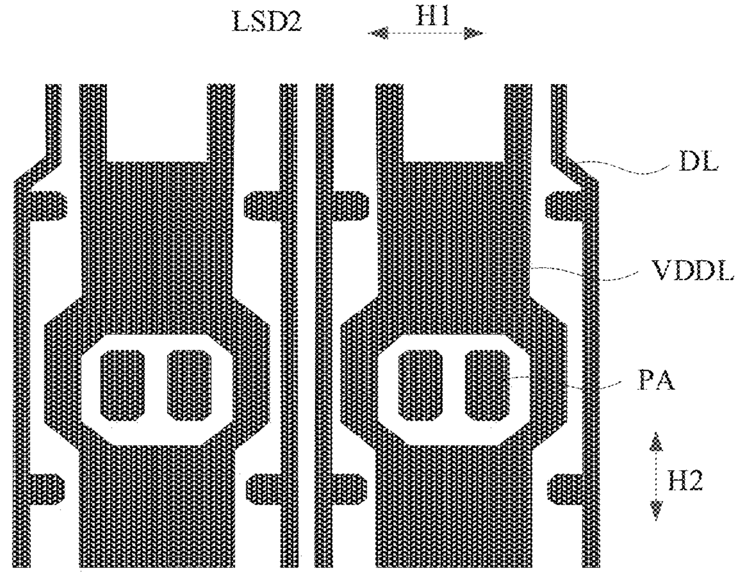
FIG. 9 is a schematic diagram of the wiring of another second source-drain metal layer provided by an embodiment of the present disclosure.
Figure 10:
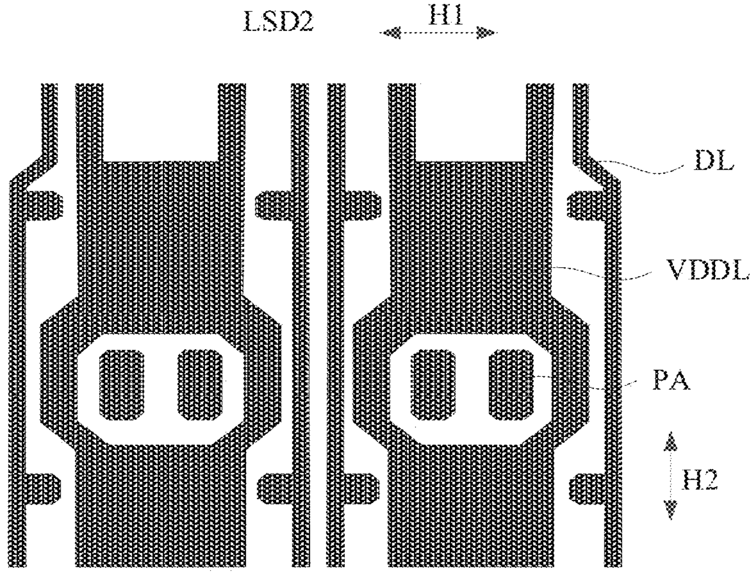
FIG. 10 is a schematic diagram of the wiring of another second source-drain metal layer according to an embodiment of the present disclosure.

In the embodiment of the present disclosure, combined with the above-mentioned situation where the source-drain metal layer includes the second source-drain metal layer LSD2, and the situation where the first electrode LAn1 of the light-emitting unit EL includes the exposed area LAn2 and the covered area LAn3, as shown in FIG. 5, FIG. 9 or FIG. 10, the second source-drain metal layer LSD2 includes multiple pairs of power wirings VDDL distributed along the row direction H1 and extending along the column direction H2. The respective pair of power wirings VDDL form multiple avoidance areas; and the second source-drain metal layer LSD2 further includes a pair of transfer electrodes PA located in the avoidance area.

In the embodiment, the two power wirings VDDL included in each pair of power wirings VDDL can overlap each other (as shown in FIG. 9), or be integrated (as shown in FIG. 10). Of course, there may also be a certain gap between the two power wirings VDDL, which is not limited in the embodiments of the present disclosure. The plurality of transfer electrodes PA include a first transfer electrode PA corresponding to the first pixel circuit PDCA1. The first transfer electrode PA1 is connected to the first source-drain metal layer LSD1 and the first end of the first transfer line TR1 respectively. The second end of the first transfer line TR1 is connected to the covered area LAn3 of one light emitting unit EL. The transfer electrode PA may extend along the column direction H2 or may extend along the row direction H1, which is not limited in the embodiment of the present disclosure.

Figure 11:
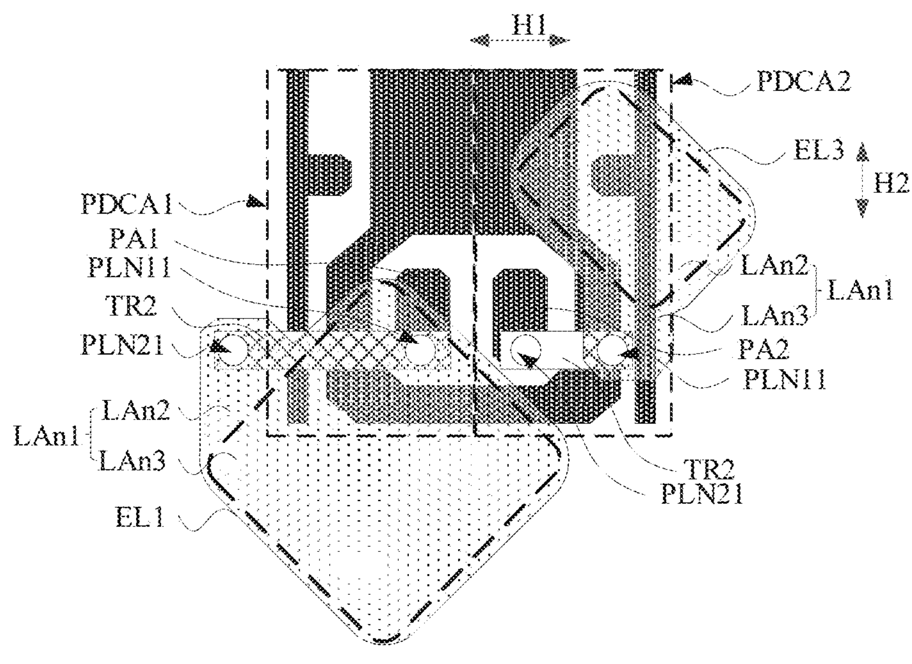
FIG. 11 is a schematic structural diagram of a second source-drain metal layer and a light-emitting unit stacked according to an embodiment of the present disclosure.

In some embodiments, as shown in FIG. 11, the first transfer line TR1 extends along the row direction H1, and the first end of the first transfer line TR1 has overlapped parts with all of at least part of the first transfer electrode PA1, the first via hole PLN11 corresponding to the first pixel circuit PDCA1, and the exposed area LAn2 of the first light-emitting unit EL1. The second end of the first transfer line TR1 has overlapped parts with both the second via hole PLN21 corresponding to the first pixel circuit PDCA1 and the covered area LAn3 of the first light-emitting unit EL1.

In the embodiment, the first light-emitting unit EL1 refers to a light-emitting unit EL correspondingly connected to the first pixel circuit PDCA1 among the plurality of light-emitting units EL. In order to realize the connection between the first pixel circuit PDCA1 and the first light-emitting unit EL1 while ensuring the planarization of the exposed area LAn2 of the first light-emitting unit EL1, the via hole connected to the first light-emitting unit EL1 (the second via hole PLN21) is transferred to the covered area LAn3 of the first light-emitting unit EL1 by the first transfer line TR1, that is, there is an overlapping portion between the second end of the first transfer line TR1 and the covered area LAn3 of the first light-emitting unit EL1.

Figure 12:
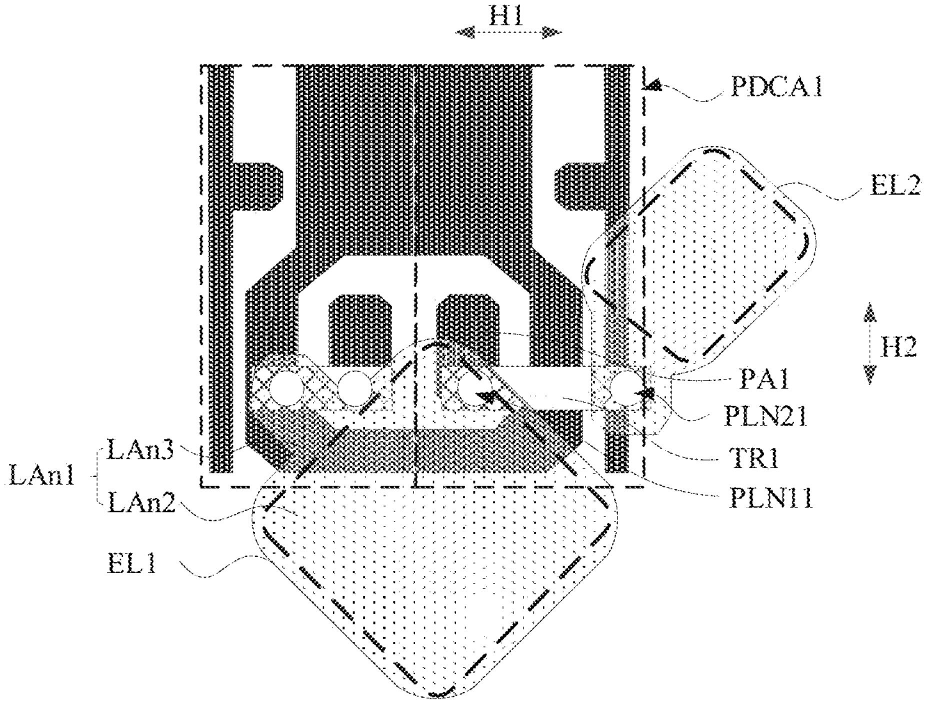
FIG. 12 is a schematic structural diagram of another second source-drain metal layer and a light-emitting unit stacked according to an embodiment of the present disclosure.

In some embodiments, as shown in FIG. 12, the first transfer line TR1 extends along the row direction H1, and the first end of the first transfer line TR1 has overlapped parts with all of at least part of the first transfer electrode PA1, the first via hole PLN11 corresponding to the first pixel circuit PDCA1, and the exposed area LAn2 of the first light-emitting unit EL1. The second end of the first transfer line TR1 has overlapped parts with both the second via hole PLN21 of the first pixel circuit PDCA1 and the covered area LAn3 of a second light-emitting unit EL2 among the plurality of light-emitting units EL, wherein the second light-emitting unit EL2 is adjacent to the first light-emitting unit EL1.

The second light-emitting unit EL2 refers to a light-emitting unit EL correspondingly connected to the first pixel circuit PDCA1 among the plurality of light-emitting units EL, and the first light-emitting unit EL1 is adjacent to the second light-emitting unit EL2. In order to realize the connection between the first pixel circuit PDCA1 and the second light-emitting unit EL2 while ensuring the planarization of the exposed area LAn2 of the first light-emitting unit EL1, the via hole directly below the first light-emitting unit EL1 (the first via hole PLN11) can be transferred to the covered area LAn3 of the second light-emitting unit EL2 by the first transfer line TR1, that is, the there is an overlapping portion between the second end of the first transfer line TR1 and the covered area LAn3 of the second light-emitting unit EL2.

In some embodiments, as shown in FIG. 11, the transfer layer TR also includes a second transfer line TR2, and the plurality of transfer electrodes PA include a second transfer electrode PA2 corresponding to the second pixel circuit PDCA2. At least part of the second transfer electrode PA2 has an overlapped part with the first via hole PLN11 corresponding to the second pixel circuit PDCA2, and does not overlap with any of the exposed areas LAn2 of the multiple light-emitting units EL. The second transfer line TR2 extends along the row direction H1, the first end of the second transfer line TR2 overlaps with at least part of the second transfer electrode PA2, the second end of the second transfer line TR2 overlaps with both the second via hole PLN21 corresponding to the second pixel circuit PDCA2, and the covered area LAn3 of a third light-emitting unit EL3 among the plurality of light-emitting units EL.

In the embodiment, there is no light-emitting unit EL directly above the first via hole PLN11 corresponding to the second pixel circuit PDCA2, which does not affect the arrangement of the light-emitting unit EL. However, in order to avoid the increased technical difficulty of ensuring accurate alignment of the corresponding second via hole PLN21 and the first via hole PLN11 of the second pixel circuit PDCA2, the technical difficulty can be reduced by disposing the second transfer line TR2, thereby facilitating the production of display panels.

In the embodiment of the present disclosure, the pixel circuit PDCA included in the pixel circuit layer DR can be a circuit of 6T1C, 7T1C, etc., as long as it can drive the light-emitting device to emit light. Hereinafter, the structure of the pixel circuit layer DR can be explained in detail using 7T1C as an example.

Figure 13:
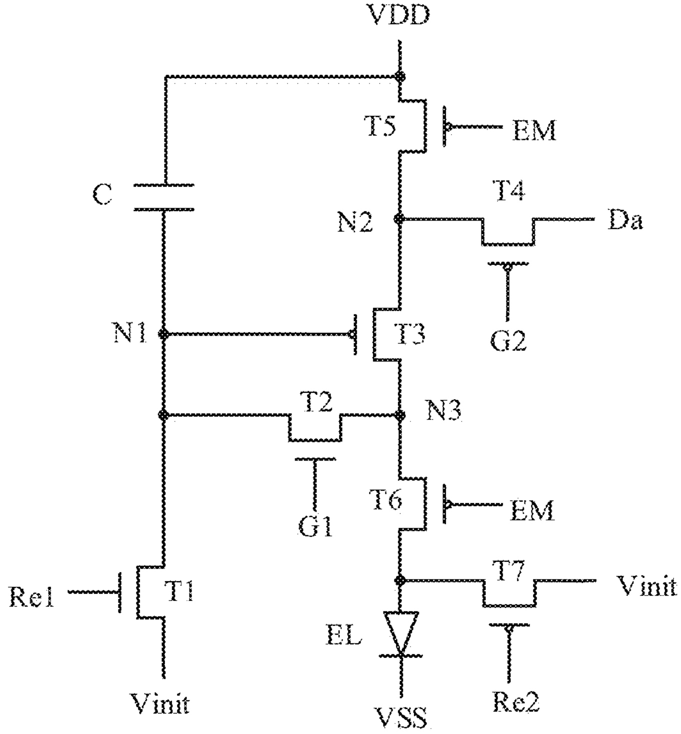
FIG. 13 is a schematic diagram of a pixel circuit provided by an embodiment of the present disclosure.

As shown in FIG. 13, the pixel circuit PDCA includes a first transistor T1, a second transistor T2, a third transistor T3, a fourth transistor T4, a fifth transistor T5, a sixth transistor T6, a seventh transistor T7 and a storage capacitor C.

Optionally, the first transistor T1 and the second transistor T2 are N-type thin film transistors, such as metal oxide thin film transistors; and the remaining transistors are P-type thin film transistors, such as low-temperature polysilicon thin film transistors.

As shown in FIG. 13, the control electrode of the first transistor T1 is used to load the capacitor reset control signal Re1, the first electrode of the first transistor T1 is used to load the initial voltage signal Vinit, and the second electrode of the first transistor T1 is connected to the first electrode of the second transistor T2, the control electrode of the third transistor T3, and one end of the storage capacitor C. The control electrode of the second transistor T2 is used to load the first scanning signal G1, and the second electrode of the second transistor T2 is connected to the first electrode of the third transistor T3 and the first electrode of the sixth transistor T6. The second electrode of the third transistor T3 is connected to the first electrode of the fourth transistor T4 and the first electrode of the fifth transistor T5. The control electrode of the fourth transistor T4 is used to load the second scan signal G2, the second electrode of the fourth transistor T4 is used to load the driving data signal Da, the control electrode of the fifth transistor T5 is used to load the enable signal EM, and the second electrode of the fifth transistor T5 is connected to the other end of the storage capacitor C, and is used to load the power supply voltage signal VDD. The control electrode of the sixth transistor T6 is used to load the enable signal EM, the second electrode of the sixth transistor T6 is connected to the first electrode of the seventh transistor T7, and is used to connect to the corresponding light-emitting unit EL. The control electrode of the seventh transistor T7 is used to load the electrode reset control signal Re2, and the second electrode of the seventh transistor T7 is used to load the initial voltage signal Vinit.

In the embodiment, the first electrode of the transistor can be one of the source electrode and the drain electrode, and the second electrode of the transistor can be the other of the source electrode and the drain electrode. In the case of using transistors with opposite polarity or in case of the direction of current being changed during the operation of the circuit, etc., the functions of "source electrode" and "drain electrode" may be interchanged. Therefore, in this specification, "source" and "drain" may be interchanged.

As shown in FIG. 1, the pixel circuit layer DR in this example includes a stacked first semiconductor layer LPoly, a first gate metal layer LG1, a second gate metal layer LG2, a second semiconductor layer LOxide, a third gate metal layer LG3, a first source-drain metal layer LSD1 and a second source-drain metal layer LSD2. The first semiconductor layer LPoly is a low-temperature polysilicon semiconductor layer, and the second semiconductor layer LOxide is a metal oxide semiconductor layer.

Hereinafter, the structure of each film layer will be explained in detail using the area corresponding to at least one pixel circuit PDCA and at least one pixel circuit island PDCC.

As shown in FIGS. 14 to 23, a pixel circuit island PDCC includes eight pixel circuits PDCA arranged in two rows and four columns. The eight pixel circuits PDCA are arranged into multiple pixel circuit groups. Each pixel circuit group includes two pixel circuits PDCA adjacent in a first direction, and the two adjacent pixel circuits PDCA are arranged in mirror symmetry.

Figure 14:
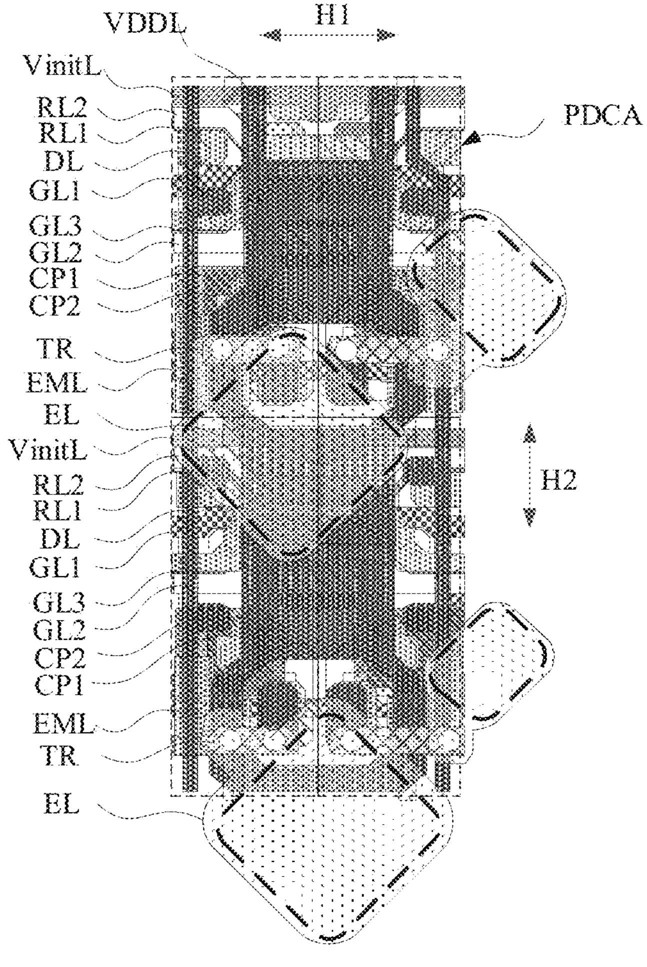
FIG. 14 is a perspective structural schematic diagram of a display panel provided by an embodiment of the present disclosure.
Figure 15:
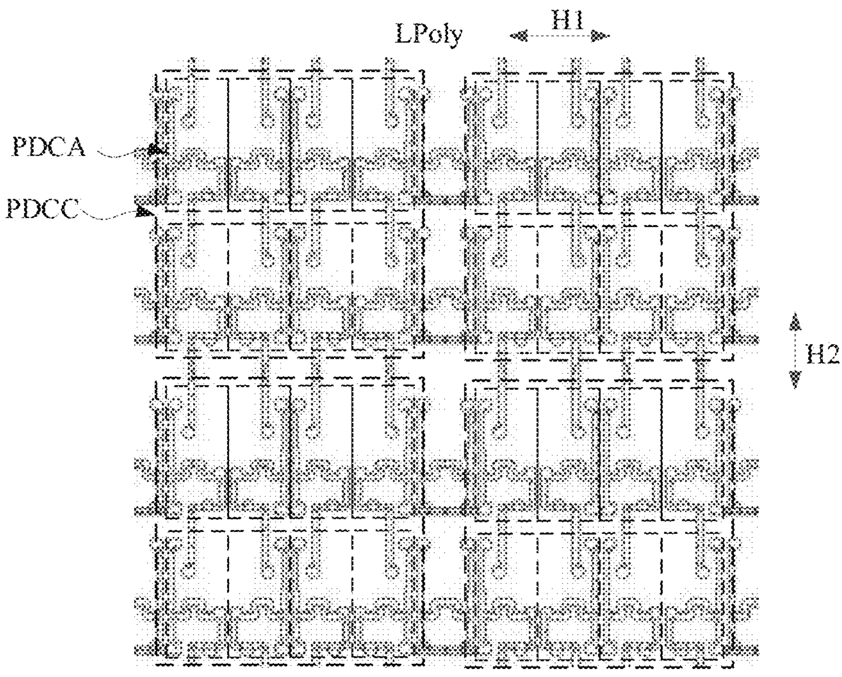
FIG. 15 is a partial structural diagram of a first semiconductor layer according to an embodiment of the present disclosure.
Figure 16:
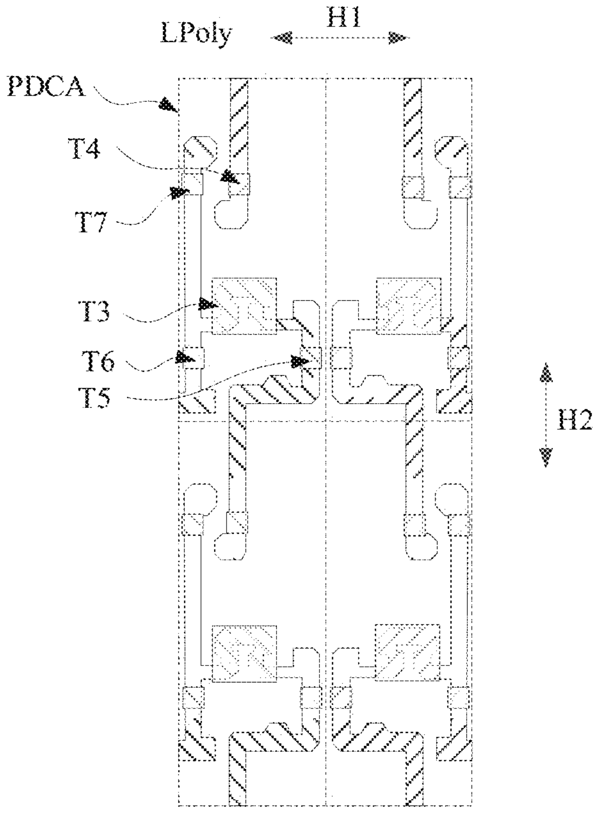
FIG. 16 is a schematic structural diagram of a first semiconductor layer in a pixel circuit region according to an embodiment of the present disclosure.

As shown in FIGS. 14, 15, and 16, the first semiconductor layer LPoly includes the active layer of each of the third transistor T3, the fourth transistor T4, the fifth transistor T5, the sixth transistor T6, and the seventh transistor T7, The active layer includes a control electrode (channel region), a first electrode (one of a source electrode and a drain electrode) and a second electrode (the other of a source electrode and a drain electrode) of each transistor.

In the embodiment, the channel regions of the fourth transistor T4 and the fifth transistor T5 are arranged along the column direction H2, and the channel regions of the fifth transistor T5 and the sixth transistor T6 are arranged along the row direction H1. Along the row direction H1, the channel region of the third transistor T3 and the channel region of the seventh transistor T7 are located between the channel region of the fifth transistor T5 and the channel region of the sixth transistor T6; along the column direction H2, the channel region of the seventh transistor T7 and the channel region of the third transistor T3 are located on the two sides of the channel region of the fifth transistor T5. The first electrode of the fourth transistor T4, the first electrode of the fifth transistor T5, and the second electrode of the third transistor T3 are connected, and the first electrode of the third transistor T3 and the second electrode of the sixth transistor T6 are connected. The first electrode of the seventh transistor T7 is connected to the first electrode of the sixth transistor T6. In two adjacent rows of pixel circuits PDCA, the channel region of the seventh transistor T7 of the previous row of pixel circuits PDCA is adjacent to the channel region of the fourth transistor T4 of the next row of pixel circuits PDCA.

Figure 17:
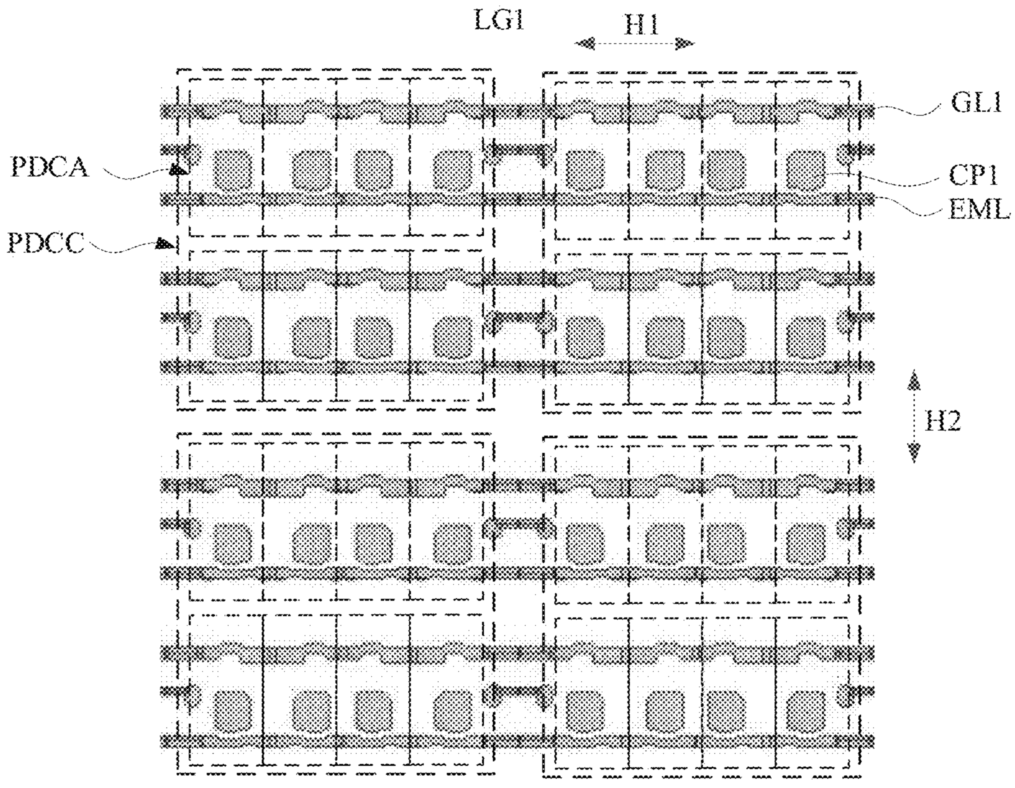
FIG. 17 is a partial structural schematic diagram of a first gate metal layer provided by an embodiment of the present disclosure.

As shown in FIGS. 14 and 17, the first gate metal layer LG1 is provided with a first scan line GL1 and an enable signal line EML that extend along the row direction H1 and are sequentially arranged along the column direction H2, and a first plate CP1 located between the first scan line GL1 and the enable signal line EML and distributed at intervals along the row direction H1.

In the embodiment, the first scan line GL1 may be used to load the first scan signal G1. The first scan line GL1 may overlap with the channel region of the fourth transistor T4, and the overlapping portion is multiplexed as the control electrode of the fourth transistor T4. The first scanning line GL1 may also overlap with the channel region of the seventh transistor T7 in the pixel circuit PDCA in the previous row, and the overlapping portion is multiplexed as the control electrode of the seventh transistor T7 in the pixel circuit PDCA in the previous row. In this way, the second reset control line RL2 connected to the pixel circuit PDCA of the previous row and the first scanning line GL1 connected to the pixel circuit PDCA of the next row are the same line. In this way, the electrode reset control signal Re2 of the pixel circuit PDCA in the previous row and the first scanning signal G1 of the pixel circuit PDCA in the next row can be the same signal.

In the embodiment, the enable signal line EML sequentially overlaps with the channel region of the fifth transistor T5 and the channel region of the sixth transistor T6, and the two overlapping parts are multiplexed as the control electrode of the fifth transistor T5 and the control electrode the sixth transistor T6 respectively. The enable signal line EML can be used to load the enable signal EM. The first electrode plate CP1 of the storage capacitor C overlaps with the channel region of the third transistor T3 to be multiplexed as the control electrode of the third transistor T3.

Figure 18:
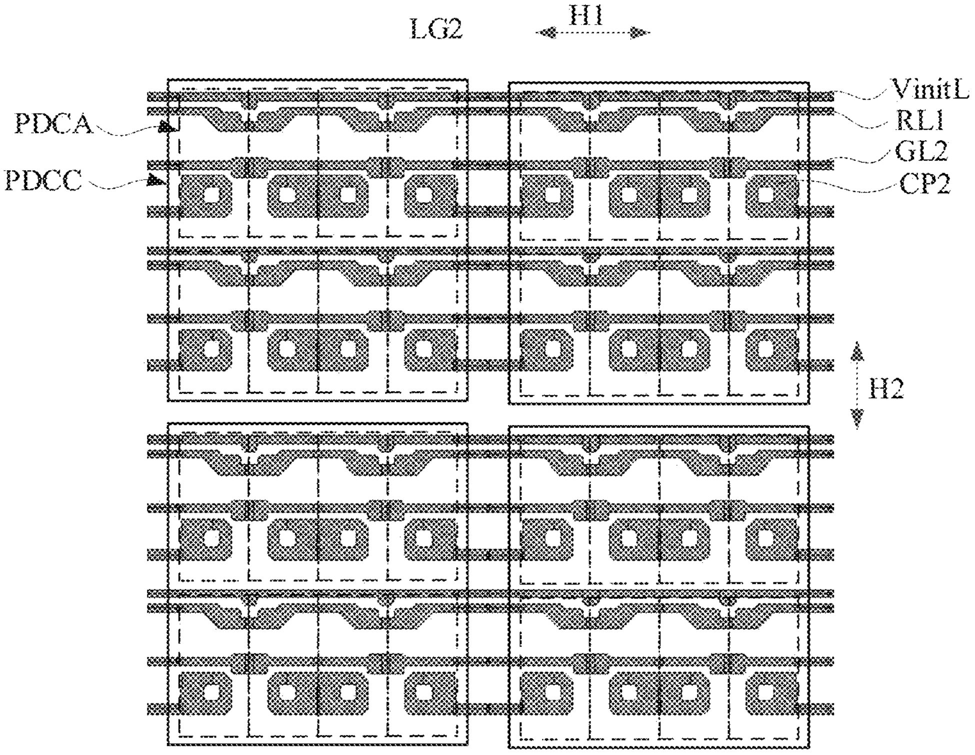
FIG. 18 is a partial structural diagram of a second gate metal layer provided by an embodiment of the present disclosure.

As shown in FIGS. 14 and 18, the second gate metal layer LG2 is provided with an initial voltage wiring VinitL, a first reset control line RL1 and a second scan wiring GL2 extending along the row direction H1 and sequentially arranged along the column direction H2, and second plates CP2 located on the side of the second scan line GL2 away from the first reset control line RL1 and distributed at intervals along the row direction H1.

In the embodiment, the initial voltage wiring VinitL is used to load the initial voltage signal Vinit, and has an overlapping portion with the first electrode of the first transistor T1 and the second electrode of the seventh transistor T7. The first reset control line RL1 is used to load the capacitor reset control signal Re1, and the second scanning line GL2 are used to load the second scanning signal G2.

Figure 19:
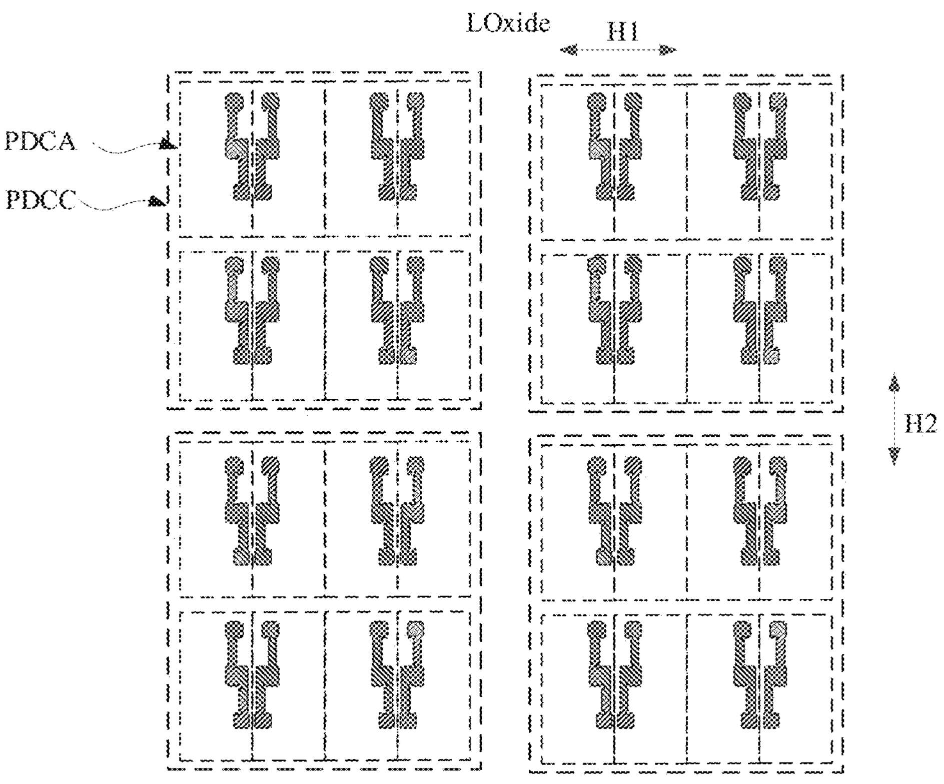
FIG. 19 is a partial structural schematic diagram of a second semiconductor layer provided by an embodiment of the present disclosure.
Figure 20:
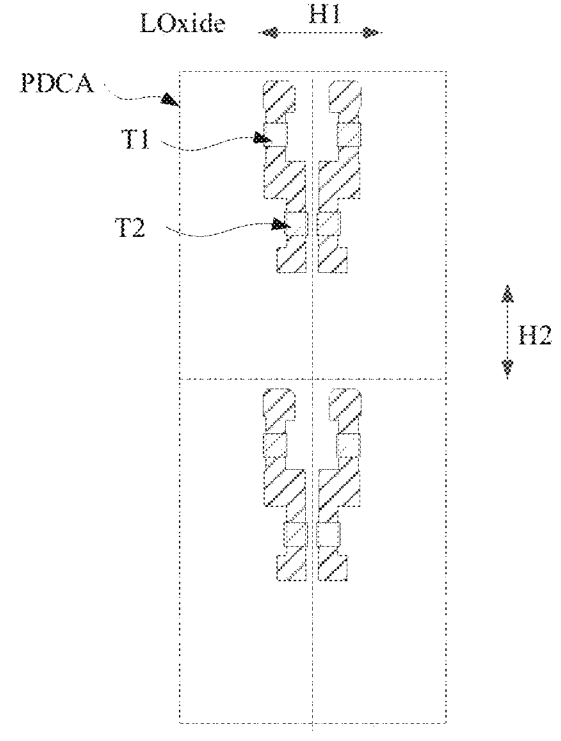
FIG. 20 is a schematic structural diagram of a second semiconductor layer in a pixel circuit region according to an embodiment of the present disclosure.

As shown in FIGS. 14, 19 and 20, the second semiconductor layer LOxide is provided with the source, drain and channel regions of the first transistor T1 and the second transistor T2.

In the embodiment, the second electrode of the first transistor T1 and the first electrode of the second transistor T2 are connected to each other. Along the column direction H2, the channel region of the first transistor T1 is located on a side of the channel region of the second transistor T2 away from the channel region of the third transistor T3. The channel region of the second transistor T2 and the channel region of the fifth transistor T5 are located on the two sides of the channel region of the third transistor T3. Along the row direction H1, the channel region of the fourth transistor T4 and the channel region of the first transistor T1 of the pixel circuit PDCA of the next row are located on the two sides of the channel region of the fourth transistor T4 of the pixel circuit PDCA of the previous row.

In the embodiment, the channel region of the first transistor T1 overlaps the first reset control line RL1, so that at least part of the overlapping portion of the first reset control line RL1 and the channel region of the first transistor T1 can be multiplexed as the first control electrode of the first transistor T1. The second scan line GL2 overlaps the channel region of the second transistor T2, so that at least part of the overlapping portion of the second scan line GL2 and the channel region of the second transistor T2 can be multiplexed as the first control electrode of the second transistor T2.

Figure 21:
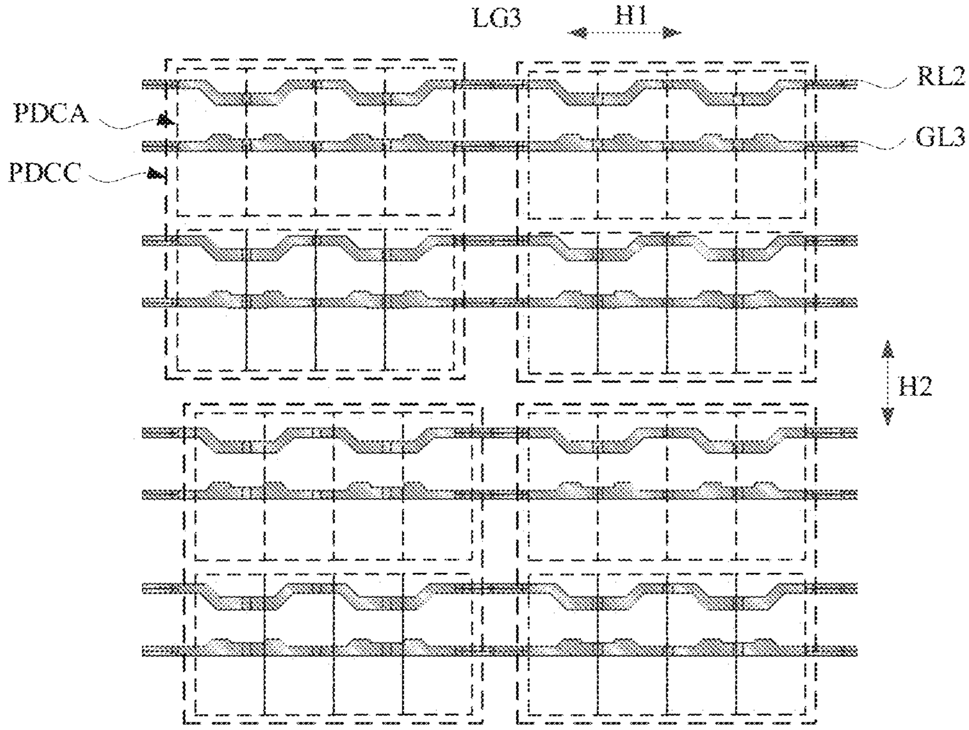
FIG. 21 is a partial structural schematic diagram of a third gate metal layer provided by an embodiment of the present disclosure.

As shown in FIGS. 14 and 21, the third gate metal layer LG3 is provided with a second reset control line RL2 and a third scan line GL3 extending along the row direction H1 and sequentially arranged along the column direction H2.

In the embodiment, the second reset control line RL2 is used to load the electrode reset control signal Re2, and the third scan line GL3 is used to load the second scan signal G2. The second reset control line RL2 overlaps with the channel area of the first transistor T1, and the overlapping part thereof is multiplexed as the second control electrode of the first transistor T1. The third scanning line GL3 overlaps with the channel region of the second transistor T2, and the overlapping portion thereof is multiplexed as the second control electrode of the second transistor T2. In this way, the first transistor T1 includes two control electrodes of the first and second control electrodes; and the second transistor T2 includes two control electrodes of the first and second control electrodes.

Figure 22:
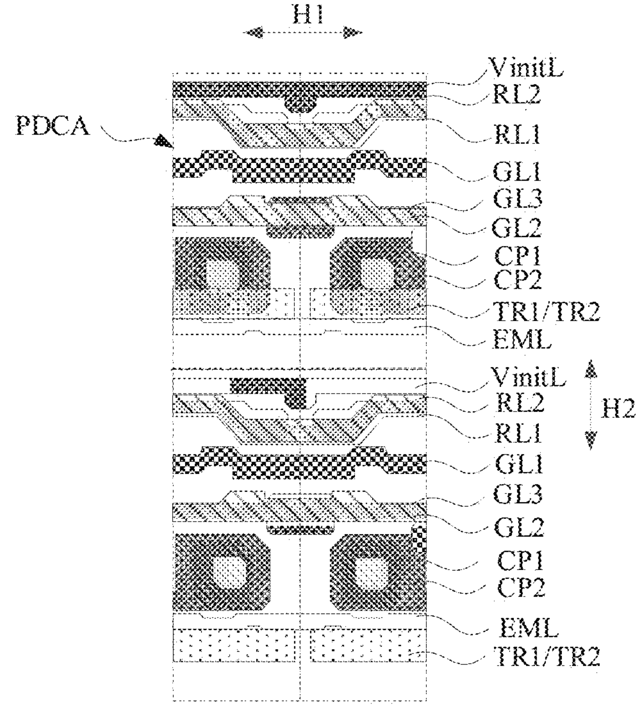
FIG. 22 is a schematic diagram of a stacked structure of a pixel circuit layer and a transfer layer according to an embodiment of the present disclosure.

As shown in FIG. 22, the initial voltage line VinitL and the first reset control line RL1 are located on the side of the first scanning line GL1 away from the enable signal line EML, and the second scanning line GL2 and the second electrode plate are located between the first scanning line GL1 and the enable signal line EML. There is an overlapping portion between the second electrode plate and the first electrode LAn1 plate, and the second electrode plate is provided with an avoidance hole that exposes a partial area of the first electrode LAn1 plate. The second reset control line RL2 is located between the initial voltage line VinitL and the first scan line, and has an overlapping portion with the first reset control line RL1. The third scan line is located between the first scan line and the second electrode, and has an overlapping portion with the second scan line GL2.

Figure 23:
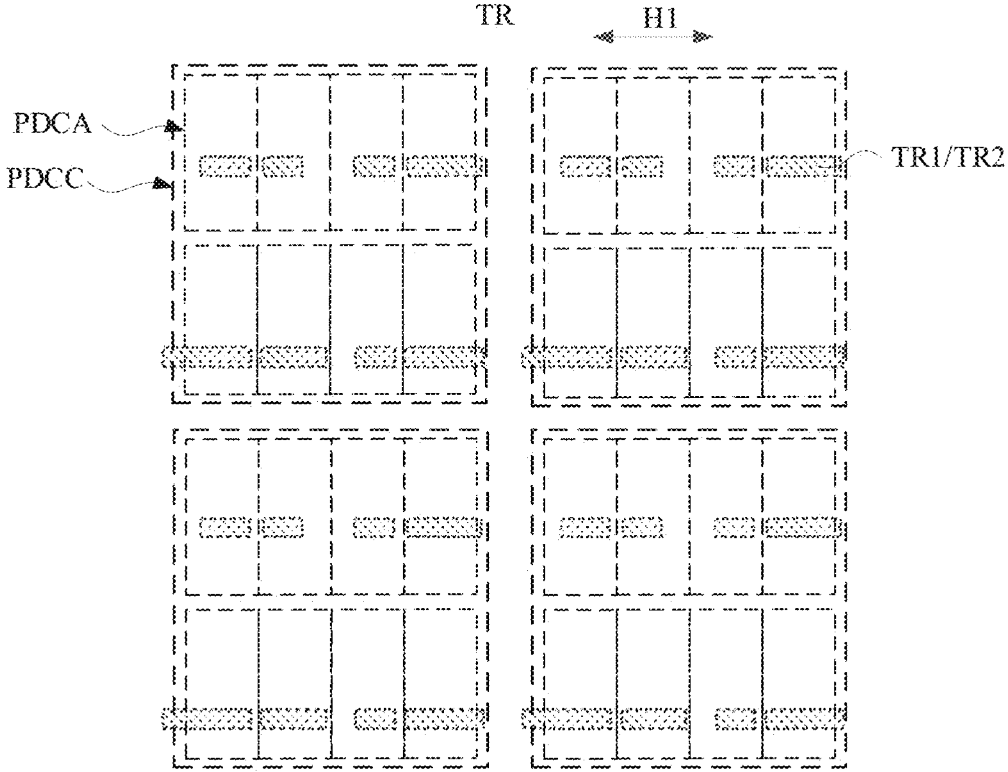
FIG. 23 is a partial structural schematic diagram of a transfer layer provided by an embodiment of the present disclosure.

As shown in FIGS. 14 and 23, the transfer layer TR includes transfer lines extending along the row direction H1, and the lengths of two adjacent transfer lines in the row direction H1 are different. The transfer line may be a first transfer line TR1 or a second transfer line TR2.

As shown in FIG. 22, in the pixel circuit island PDCC, the transfer line corresponding to the previous row of pixel circuits PDCA in the two adjacent rows of pixel circuits PDCA is located on the side of the enable signal line EML close to the second electrode plate CP2, and has an overlapping portion with the second plate CP2, and the transfer line corresponding to the next row of pixel circuits PDCA is located on the side of the enable signal line EML away from the second plate CP2.

Figure 24:
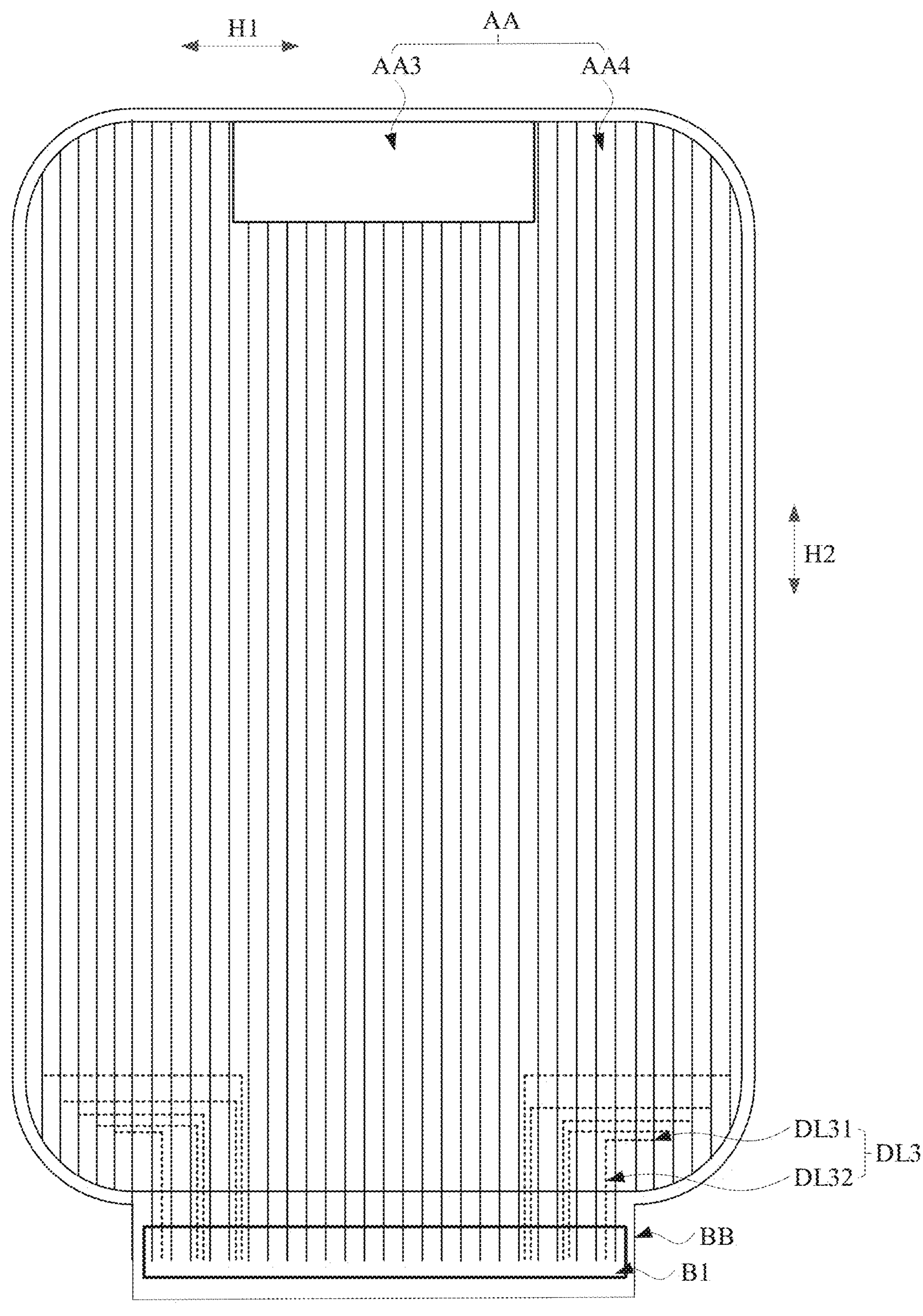
FIG. 24 is a schematic structural diagram of another display panel provided by an embodiment of the present disclosure.

In the embodiment of the present disclosure, as shown in FIG. 24, the display area includes a transparent display area AA3 and a normal display area AA4 located at the periphery of the transparent display area AA3.

In the embodiment, combined with the above-mentioned main display area AA1 and secondary display area AA2, the transparent display area AA3 can be located in the main display area AA1. At this time, the secondary display area AA2 and other areas of the main display area AA1 are normal display areas AA4. Alternatively, the transparent display area AA3 is located in the secondary display area AA2, and at this time, the main display area AA1 and other areas of the secondary display area AA2 are normal display areas AA4.

In the embodiment, the distribution density of the pixel circuits PDCA in the transparent display area AA3 is smaller than the distribution density of the pixel circuits PDCA in the normal display area AA4 (for example, the number of pixel circuits PDCA in the transparent display area AA3 is 0, that is, all the multiple pixel circuits PDCA included in the display panel are located in the normal display area AA4) to ensure that the transparent display area AA3 has a certain light transmittance, thereby ensuring the effect of under-screen camera.

In the embodiment of the present disclosure, part of the multiple light-emitting units EL included in the light-emitting layer EE are located in the normal display area AA4, and the remaining part are located in the transparent display area AA3. While realizing the under-screen camera function, in order to ensure the normal display of the image in the transparent display area AA3, the plurality of pixel circuits PDCA include third pixel circuits PDCA located in the normal display area AA4, and each third pixel circuit PDCA is connected to a light-emitting unit EL in the transparent display area AA3.

In order to realize the connection between the third pixel circuit PDCA and the light-emitting unit EL of the transparent display area AA3, since there is a misalignment between the third pixel circuit PDCA and the light-emitting unit EL to be connected, the above-mentioned transfer layer TR can be reused at this time to realize the connection between the third pixel circuit PDCA and the light-emitting unit EL of the transparent display area AA3 through the transfer layer TR. That is, the transfer layer TR further includes a third transfer line, one end of the third transfer line is electrically connected to the third pixel circuit PDCA, and the other end of the third transfer line is connected to a light-emitting unit EL in the transparent display area AA3.

In the embodiment, the fewer the number of pixel circuits PDCA included in the transparent display area AA3, the greater the number of third pixel circuits PDCA, and at this time, the number of third transfer lines will also be greater. In this way, in order to facilitate the arrangement of the large number of the third transfer lines, the transfer layer TR may be the multi-layer structure layer described above, that is, multiple third transfer lines are provided through multiple transfer sub-layers TR.

Figure 25:
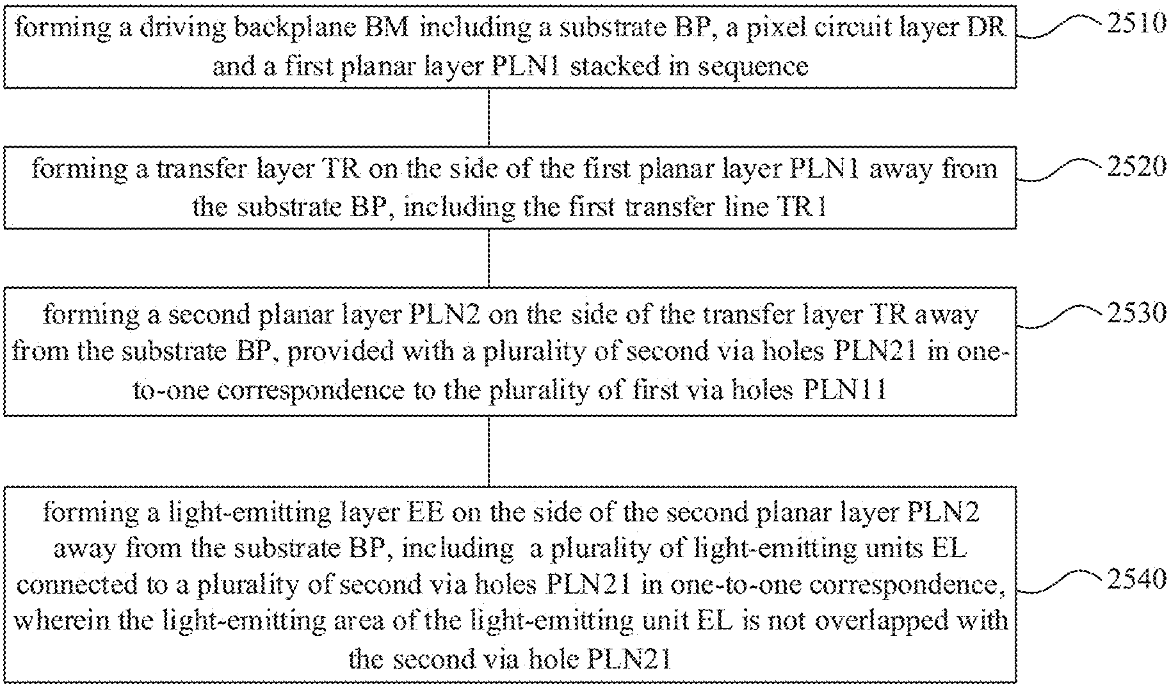
FIG. 25 is a schematic flowchart of a display panel manufacturing method provided by an embodiment of the present disclosure.

An embodiment of the present disclosure provides a method for manufacturing a display panel, which method can be used to manufacture the display panel described in the above embodiment. As shown in FIG. 25, the method includes the following steps 2510 to 2540.

Step 2510: forming a driving backplane BM. The driving backplane BM includes a substrate BP, a pixel circuit layer DR and a first planar layer PLN1 stacked in sequence.

In the embodiment, the display panel includes a display area and a peripheral area BB located outside the display area. The display area includes a main display area AA1 and a secondary display area AA2 located on one side or both sides of the main display area AA1 along the row direction H1. The peripheral area BB includes a binding area B1 located on one side of the display area in the column direction H2. The pixel circuit layer DR includes multiple pixel circuits PDCA, multiple data wirings DL and multiple data transfer lines DL3. One column of pixel circuits PDCA is connected to one data wiring DL. At least some of the pixel circuits PDCA located in the main display area AA1 form multiple pixel circuit islands PDCC distributed in an array. Multiple data transfer lines DL3 are located in the main display area AA1 and do not overlap with the pixel circuit islands PDCC. One end of a data transfer line DL3 is connected to a data wiring DL in the secondary display area AA2, and the other end is extended to the bonding area B1. The first planar layer PLN1 is provided with a plurality of first via holes PLN11 connected to a plurality of pixel circuits PDCA in one-to-one correspondence.

Step 2520: forming a transfer layer TR on the side of the first planar layer PLN1 away from the substrate BP. The transfer layer TR includes the first transfer line TR1.

Step 2530: forming a second planar layer PLN2 on the side of the transfer layer TR away from the substrate BP. The second planar layer PLN2 is provided with a plurality of second via holes PLN21 corresponding to the plurality of first via holes PLN11. The plurality of pixel circuit islands PDCC include a first pixel circuit PDCA1, and the two ends of the first transfer line TR1 are respectively connected to the first via hole PLN11 and the second via hole PLN21 corresponding to the first pixel circuit PDCA1.

Step 2540. forming a light-emitting layer EE on the side of the second planar layer PLN2 away from the substrate BP. The light-emitting layer EE includes a plurality of light-emitting units EL connected to a plurality of second via holes PLN21 in one-to-one correspondence. The light-emitting area of the light-emitting unit EL is not overlapped with the second via hole PLN21. The light-emitting unit EL includes a first light-emitting unit EL1, and the light-emitting area of the first light-emitting unit EL1 has an overlapped portion with the first via hole PLN11 corresponding to the first pixel circuit PDCA1.

In the embodiment of the present disclosure, the structure of the display panel manufactured by the above-mentioned manufacturing method can refer to the display panel described in the above-mentioned embodiment, which will not be described again in the embodiment of the present disclosure. In the display panel, under the switching effect of the data transfer line DL3, the data wiring DL of the secondary display area AA2 are adjusted to be extended from the main display area AA1 to the binding area B1, thus avoiding the technical problem of enlarging the frame of the display device due to directly extending from the secondary display area AA2 to the binding area B1. In addition, after shrinking the pixel circuit PDCA, by providing the first transfer line TR1, the connection point of the first light-emitting unit EL1 is transferred from the first via hole PLN11 to the position of the second via hole PLN21, which can ensure the flattening of the first light-emitting unit EL1 when the light-emitting layer EE is subsequently produced, thereby avoiding the problem of color shift in the display screen of the produced display panel.

It should be noted that, although respectively steps of the manufacturing method of the display panel in the present disclosure are described in a specific order in the drawings, this does not require or imply that these steps must be performed in the specific order, or that all steps must be performed to achieve the desired results. Additionally or alternatively, certain steps may be omitted, multiple steps may be combined into one step for execution, and/or one step may be decomposed into multiple steps for execution, etc.

Other embodiments of the disclosure will be readily apparent to those skilled in the art from consideration of the specification and practice of the invention disclosed herein. This application is intended to cover any variations, uses, or adaptations of the disclosure that follow the general principles of the disclosure and include common knowledge or customary technical means in the technical field that are not disclosed in the disclosure. It is intended that the specification and examples be considered as exemplary only, with a true scope and spirit of the disclosure being indicated by the following claims.

What is claimed is:

1. A display panel, comprising a display area and a peripheral area located outside the display area, wherein the peripheral area comprises a binding area located on one side of the display area along a column direction, and the display panel comprises:

- a driving backplane comprising a substrate, a pixel circuit layer and a first planar layer stacked in sequence;
- wherein the pixel circuit layer comprises a plurality of pixel circuits, a plurality of data wiring lines and a plurality of data transfer lines, one column of the pixel circuits is connected to one of the data wiring lines, at least part of the pixel circuits located in the display area form a plurality of pixel circuit islands distributed in an array, a plurality of the data transfer lines are located in the display area and do not overlap with the pixel circuit islands, one end of one of the data transfer lines is connected to one of the data wiring lines in the display area, and other end is extended to the binding area;
- a plurality of first via holes connected to the plurality of pixel circuits in one-to-one correspondence are disposed in the first planar layer;
- a transfer layer, located on a side of the first planar layer away from the substrate, and comprising a first transfer line;
- a second planar layer, located on a side of the transfer layer away from the substrate, and provided with a plurality of second via holes corresponding to the plurality of first via holes in one-to-one correspondence, wherein the plurality of pixel circuit islands comprises a first pixel circuit, and two ends of the first transfer line are respectively connected to the first via hole and the second via hole corresponding to the first pixel circuit; and
- a light-emitting layer, located on a side of the second planar layer away from the substrate, and comprising a plurality of light-emitting units connected to the plurality of second via holes in one-to-one correspondence, wherein light-emitting areas of the light-emitting units are not overlapped with the second via holes, the plurality of light-emitting units comprises a first light-emitting unit, and the light-emitting area of the first light-emitting unit has an overlapping portion with the first via hole corresponding to the first pixel circuit;
- wherein the plurality of pixel circuit islands comprises a second pixel circuit; and wherein the light-emitting areas of the plurality of light-emitting units do not overlap with the first via hole corresponding to the second pixel circuit, and the first via hole corresponding to the second pixel circuit has an overlapping portion with the corresponding second via hole.

2. The display panel according to claim 1, wherein the plurality of pixel circuit islands comprises a second pixel circuit, and the transfer layer further comprises a second transfer line; and

- wherein the light-emitting areas of the plurality of light-emitting units do not overlap with the first via hole corresponding to the second pixel circuit, the first via hole corresponding to the second pixel circuit do not overlap with the corresponding second via hole, and two ends of the second transfer line are respectively connected to the first via hole and the second via hole corresponding to the second pixel circuit.

3. The display panel according to claim 1, wherein the transfer layer comprises multiple layers of transfer sub-layers and an interlayer insulating layer located between any two adjacent transfer sub-layers; and

- the multiple transfer sub-layers each comprises a first transfer sub-line, and the interlayer insulating layer comprises a via hole, and the via hole is connected to the first transfer sub-lines of the transfer sub-layers located on both sides, and the multiple first transfer sub-lines are connected in sequence to form the first transfer line.

4. The display panel according to claim 1, wherein the pixel circuit layer comprises a transistor layer, a first source-drain metal layer, a third planar layer and a second source-drain metal layer sequentially stacked in a direction away from the substrate;

- the second source-drain metal layer comprises a plurality of pairs of power wirings arranged along a row direction and extended along the column direction, each pair of the power wirings forms a plurality of avoidance areas, and the second source-drain metal layer further comprises a pair of transfer electrodes located in the avoidance area and extended along the column direction, the plurality of transfer electrodes comprises a first transfer electrode corresponding to the first pixel circuit, and the first transfer electrode is connected to the first source-drain metal layer and a first end of the first transfer line respectively; and
- the light-emitting layer further comprises a pixel definition layer provided on a surface of the first planar layer away from the substrate, the pixel definition layer is provided with pixel openings corresponding to the plurality of the light-emitting units in one-to-one correspondence, each light-emitting unit comprises a first electrode, an organic light-emitting layer and a second electrode sequentially stacked on one side in a direction away from the second planar layer, the first electrode comprises an exposed area exposed at a corresponding pixel opening and a covered area covered by the pixel definition layer, the exposed area of the first electrode forms a light-emitting area of the corresponding light-emitting unit, and a second end of the first transfer line is connected to the covered area of the light-emitting unit.

5. The display panel according to claim 4, wherein the first transfer line is extended along the row direction, and the first end of the first transfer line has an overlapping portion with at least a part of the first transfer electrode, the first via hole corresponding to the first pixel circuit and the exposed area of the first light-emitting unit, and the second end of the first transfer line has an overlapping portion with the second via hole corresponding to the first pixel circuit and the covered area of the light-emitting unit.

6. The display panel according to claim 4, wherein the first transfer line is extended along the row direction, and the first end of the first transfer line has an overlapping portion with at least a part of the first transfer electrode, the first via hole corresponding to the first pixel circuit and the exposed area of the first light-emitting unit, the second end of the first transfer line has an overlapping portion with the second via hole corresponding to the first pixel circuit and the covered area of a second light-emitting unit among the plurality of light-emitting units, and the second light-emitting unit is adjacent to the first light-emitting unit.

7. The display panel according to claim 4, wherein the transfer layer further comprises a second transfer line, and the plurality of transfer electrodes comprises a second transfer electrode corresponding to the second pixel circuit;

at least part of the second transfer electrode is overlapped with the first via hole corresponding to the second pixel circuit, and is not overlapped with the exposed areas of the plurality of light-emitting units; and the second transfer line is extended along the row direction, a first end of the second transfer line has an overlapping portion with at least part of the second transfer electrode, and a second end of the second transfer line has an overlapping portion with the second via hole corresponding to the second pixel circuit and the covered area of a third light-emitting unit among the plurality of light-emitting units.

8. The display panel according to claim 4, wherein the data transfer line comprises a first segment of wiring and a second segment of wiring;

the first segment of wiring is extended along the row direction, the second segment of wiring is extended along the column direction, one end of the first segment of wiring is connected to a data wiring, other end of the first segment of wiring is connected to one end of the second segment of wiring, and other end of the second segment of wiring is extended to the binding area; and first segment of wirings and part of the second segment of wirings of the plurality of data transfer lines are located on the first source-drain metal layer, and remaining second segment of wirings of the plurality of data transfer lines are located on the second source-drain metal layer.

9. The display panel according to claim 1, wherein the pixel circuit comprises a first transistor, a second transistor, a third transistor, a fourth transistor, a fifth transistor, a sixth transistor, a seventh transistor and a storage capacitor;

a control electrode of the first transistor is used to load a capacitor reset control signal, a first electrode of the first transistor is used to load an initial voltage signal, and a second electrode of the first transistor is connected to a first electrode of the second transistor, a control electrode of the third transistor, and one end of the storage capacitor;

a control electrode of the second transistor is used to load a first scan signal, and a second electrode of the second transistor is connected to a first electrode of the third transistor and a first electrode of the sixth transistor;

a second electrode of the third transistor is connected to a first electrode of the fourth transistor and a first electrode of the fifth transistor, a control electrode of the fourth transistor is used to load a second scan signal, a second electrode of the fourth transistor is used to load a driving data signal, a control electrode of the fifth transistor is used to load an enable signal, a second electrode of the fifth transistor is connected to other end of the storage capacitor, and is used to load a power supply voltage signal; and a control electrode of the sixth transistor is used to the an enable signal, a second electrode of the sixth transistor is connected to a first electrode of the seventh transistor and is used to connect to the corresponding light-emitting unit, a control electrode of the seventh transistor is used to load an electrode reset control signal, and a second electrode of the seventh transistor is used to load the initial voltage signal.

10. The display panel according to claim 9, wherein the pixel circuit layer comprises a first semiconductor layer, a first gate metal layer, a second gate metal layer, a second semiconductor layer, a third gate metal layers and a source-drain metal layer;

the first semiconductor layer comprises an active layer of each of the third transistor, the fourth transistor, the fifth transistor, the sixth transistor, and the seventh transistor, and the second semiconductor layer comprises an active layer of each of the first transistor and the second transistor;

the first gate metal layer is provided with a first scan line and an enable signal line extending along the row direction and sequentially arranged along the column direction, and first electrode plates located between the first scan line and the enable signal line and spaced apart along the row direction, the first scan line is used to load the first scan signal, and the enable signal line is used to load the enable signal;

the second gate metal layer is provided with an initial voltage wiring, a first reset control line and a second scan wiring extending along the row direction and sequentially arranged along the column direction, and second electrode plates located at a side of the second scan wiring away from the first reset control line and spaced apart along the row direction, the initial voltage wiring is used to load the initial voltage signal, the first reset control line is used to load the capacitor reset control signal, and the second scan line is used to load the second scan signal;

the third gate metal layer is provided with a second reset control line and a third scan line extending along the row direction and sequentially arranged along the column direction, the second reset control line is used to load the electrode reset control signal, and the third scan line is used to load the second scan signal;

the initial voltage wiring and the first reset control line are located on a side of the first scan wiring away from the enable signal line, the second scan wiring and the second electrode plate are located between the first scan wiring and the enable signal line, and the second plate has an overlapping portion with the first plate, the second reset control line is located between the initial voltage wiring and the first scan line, and has an overlapping portion with the first reset control line, and the third scan line is located between the first scan line and the second electrode and has an overlapping portion with the second scan wiring; and the transfer layer comprises the transfer line extending along the row direction, and the transfer line corresponding to a previous row of pixel circuits in two adjacent rows of pixel circuits in the pixel circuit island is located on a side of the enable signal line close to the second electrode plate, and has an overlapping portion with the second electrode plate, and the transfer line corresponding to a next row of pixel circuits is located on a side of the enable signal line away from the second electrode plate.

11. The display panel according to claim 1, wherein the display area comprises a transparent display area and a normal display area located at the periphery of the transparent display area; and a distribution density of the pixel circuits in the transparent display area is smaller than the distribution density of the pixel circuits in the normal display area, the plurality of pixel circuits comprise a third pixel circuit located in the normal display area, the transfer layer further comprises a third transfer line, and two ends of the third transfer line are respectively connected to the third pixel circuit and one of the light-emitting units in the transparent display area.

12. The display panel according to claim 1, wherein the display area comprises a main display area and a secondary display area located on one side or both sides of the main display area along the row direction; and the plurality of pixel circuit islands and the plurality of data transfer lines are located in the main display area, and one end of one of the data transfer lines is extended into the secondary display area and is connected to one of the data wirings, and other end is extended to the binding area.

13. The display panel according to claim 1, wherein the material of the first transfer line is a transparent conductive material.

14. A method of manufacturing display panel, comprising:

forming a driving backplane, the driving backplane comprising a substrate, a pixel circuit layer and a first planar layer stacked in sequence;

wherein display panel comprises a display area and a peripheral area located outside the display area, wherein the peripheral area comprises a binding area located on one side of the display area along a column direction, the pixel circuit layer comprises a plurality of pixel circuits, a plurality of data wiring lines and a plurality of data transfer lines, one column of the pixel circuits is connected to one of the data wiring lines, at least part of the pixel circuits located in the display area form a plurality of pixel circuit islands distributed in an array, a plurality of the data transfer lines are located in the display area and do not overlap with the pixel circuit islands, one end of one of the data transfer lines is connected to one of the data wiring lines in the display area, and other end is extended to the binding area, and a plurality of first via holes connected to the plurality of pixel circuits in one-to-one correspondence are disposed in the first planar layer;

forming a transfer layer on a side of the first planar layer away from the substrate, the transfer layer comprising a first transfer line;

forming a second planar layer on a side of the transfer layer away from the substrate, wherein the second planar layer is provided with a plurality of second via holes corresponding to the plurality of first via holes in one-to-one correspondence, the plurality of pixel circuit islands comprises a first pixel circuit, and two ends of the first transfer line are respectively connected to the first via hole and the second via hole corresponding to the first pixel circuit; and forming a light-emitting layer on a side of the second planar layer away from the substrate, the light-emitting layer comprising a plurality of light-emitting units connected to the plurality of second via holes in one-to-one correspondence, wherein light-emitting areas of the light-emitting units are not overlapped with the second via holes, the plurality of light-emitting units comprises a first light-emitting unit, and the light-emitting area of the first light-emitting unit has an overlapping portion with the first via hole corresponding to the first pixel circuit;

wherein the plurality of pixel circuit islands comprises a second pixel circuit; and wherein the light-emitting areas of the plurality of light-emitting units do not overlap with the first via hole corresponding to the second pixel circuit, and the first via hole corresponding to the second pixel circuit has an overlapping portion with the corresponding second via hole.

15. A display device, comprising a display panel, the display panel comprising a display area and a peripheral area located outside the display area, wherein the peripheral area comprises a binding area located on one side of the display area along a column direction, and the display panel comprises:

a driving backplane comprising a substrate, a pixel circuit layer and a first planar layer stacked in sequence;

wherein the pixel circuit layer comprises a plurality of pixel circuits, a plurality of data wiring lines and a plurality of data transfer lines, one column of the pixel circuits is connected to one of the data wiring lines, at least part of the pixel circuits located in the display area form a plurality of pixel circuit islands distributed in an array, a plurality of the data transfer lines are located in the display area and do not overlap with the pixel circuit islands, one end of one of the data transfer lines is connected to one of the data wiring lines in the display area, and other end is extended to the binding area;

a plurality of first via holes connected to the plurality of pixel circuits in one-to-one correspondence are disposed in the first planar layer;

a transfer layer, located on a side of the first planar layer away from the substrate, and comprising a first transfer line;

a second planar layer, located on a side of the transfer layer away from the substrate, and provided with a plurality of second via holes corresponding to the plurality of first via holes in one-to-one correspondence, wherein the plurality of pixel circuit islands comprises a first pixel circuit, and two ends of the first transfer line are respectively connected to the first via hole and the second via hole corresponding to the first pixel circuit; and a light-emitting layer, located on a side of the second planar layer away from the substrate, and comprising a plurality of light-emitting units connected to the plurality of second via holes in one-to-one correspondence, wherein light-emitting areas of the light-emitting units are not overlapped with the second via holes, the plurality of light-emitting units comprises a first light-emitting unit, and the light-emitting area of the first light-emitting unit has an overlapping portion with the first via hole corresponding to the first pixel circuit;

wherein the plurality of pixel circuit islands comprises a second pixel circuit; and wherein the light-emitting areas of the plurality of light-emitting units do not overlap with the first via hole corresponding to the second pixel circuit, and the first via hole corresponding to the second pixel circuit has an overlapping portion with the corresponding second via hole.

16. The display device according to claim 15, wherein the plurality of pixel circuit islands comprises a second pixel circuit, and the transfer layer further comprises a second transfer line; and wherein the light-emitting areas of the plurality of light-emitting units do not overlap with the first via hole corresponding to the second pixel circuit, the first via hole corresponding to the second pixel circuit do not overlap with the corresponding second via hole, and two ends of the second transfer line are respectively connected to the first via hole and the second via hole corresponding to the second pixel circuit.

17. The display device according to claim 15, wherein the transfer layer comprises multiple layers of transfer sub-layers and an interlayer insulating layer located between any two adjacent transfer sub-layers; and the multiple transfer sub-layers each comprises a first transfer sub-line, and the interlayer insulating layer comprises a via hole, and the via hole is connected to the first transfer sub-lines of the transfer sub-layers located on both sides, and the multiple first transfer sub-lines are connected in sequence to form the first transfer line.

18. The display device according to claim 15, wherein the pixel circuit layer comprises a transistor layer, a first source-drain metal layer, a third planar layer and a second source-drain metal layer sequentially stacked in a direction away from the substrate;

the second source-drain metal layer comprises a plurality of pairs of power wirings arranged along a row direction and extended along the column direction, each pair of the power wirings forms a plurality of avoidance areas, and the second source-drain metal layer further comprises a pair of transfer electrodes located in the avoidance area and extended along the column direction, the plurality of transfer electrodes comprises a first transfer electrode corresponding to the first pixel circuit, and the first transfer electrode is connected to the first source-drain metal layer and a first end of the first transfer line respectively; and the light-emitting layer further comprises a pixel definition layer provided on a surface of the first planar layer away from the substrate, the pixel definition layer is provided with pixel openings corresponding to the plurality of the light-emitting units in one-to-one correspondence, each light-emitting unit comprises a first electrode, an organic light-emitting layer and a second electrode sequentially stacked on one side in a direction away from the second planar layer, the first electrode comprises an exposed area exposed at a corresponding pixel opening and a covered area covered by the pixel definition layer, the exposed area of the first electrode forms a light-emitting area of the corresponding light-emitting unit, and a second end of the first transfer line is connected to the covered area of the light-emitting unit.

* * * * *